(12) United States Patent
Wu

(10) Patent No.: US 8,718,987 B2
(45) Date of Patent: May 6, 2014

(54) CIRCUIT SIMULATION MODEL OF CAPACITOR, CONSTRUCTING METHOD OF SIMULATION MODEL, METHOD OF CIRCUIT SIMULATION, CIRCUIT SIMULATOR

(75) Inventor: Xiangying Wu, Gunma (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 264 days.

(21) Appl. No.: 13/350,351

(22) Filed: Jan. 13, 2012

(65) Prior Publication Data

US 2012/0185223 A1 Jul. 19, 2012

(30) Foreign Application Priority Data

Jan. 17, 2011 (JP) ................. 2011-007389

(51) Int. Cl.
*G06F 17/10* (2006.01)
(52) U.S. Cl.
USPC ............ 703/2; 703/3; 703/4; 703/13; 703/14; 703/15; 716/113; 716/108; 702/57; 702/75; 320/166; 320/167; 324/548; 324/661
(58) Field of Classification Search
None
See application file for complete search history.

(56) References Cited

U.S. PATENT DOCUMENTS

2011/0307235 A1 12/2011 Wu

FOREIGN PATENT DOCUMENTS

JP 2012-3409 A 1/2012

OTHER PUBLICATIONS

Bi-Shiou Chiou, Sin-Tah Lin Equivalent Circuit Model in Grain-Boundary Barrier Layer Capacitors J. Am. Ceram. Soc., 72(10), pp. 1967-1975, 1989.*
Svante Westelund Capacitor Theory IEEE Transactions on Dielectrics and Electrical Insulation, vol. 1 No. 5, pp. 826-839, Oct. 1994.*
Prymak, "SPICE Modeling of Capacitors", CARTS—1995, Components Technology Institute, Inc., pp. 1-5.
Hirasuna et al., "A Nonlinear Capacitor Model for Use in PSpice", OrCAD Technical Support, Apr. 1999.

* cited by examiner

*Primary Examiner* — Omar Fernandez Rivas
*Assistant Examiner* — Cuong Luu
(74) *Attorney, Agent, or Firm* — Chen Yoshimura LLP

(57) ABSTRACT

Provided is a circuit simulation model that can suitably represent capacitor characteristics, thereby realizing accurate circuit design and circuit analysis. A SPICE model is constituted of a capacitor unit in which a capacitor is replaced with a linear voltage dependent current source, a low-pass filter unit that has a function of extracting a DC bias voltage, a calculation circuit unit that is configured by combining an adder, a multiplier, and the like to perform a calculation of a circuit equation derived from an equivalent circuit for a capacitor such as an idealized C circuit model, an RC circuit model, or the like, and a linear voltage dependent voltage source that applies a total voltage applied across the capacitor to the calculation circuit.

6 Claims, 18 Drawing Sheets

CIRCUIT SIMULATION MODEL OF CAPACITOR, CONSTRUCTING METHOD OF SIMULATION MODEL, METHOD OF CIRCUIT SIMULATION, CIRCUIT SIMULATOR

This application claims the benefit of Japanese Application No. 2011-007389, filed in Japan on Jan. 17, 2011, which is hereby incorporated by reference in its entirety.

This application also hereby incorporates by reference U.S. patent application Ser. No. 13/160,394 in its entirety.

TECHNICAL FIELD

The present invention relates to a circuit simulation model for a capacitor with a DC bias applied thereto, a constructing method of the simulation model, a circuit simulation method, and a circuit simulator, and more particularly, to a circuit simulation model for a capacitor that is suitable for a simulation with a SPICE simulator, a constructing method of the simulation model, a circuit simulation method, and a circuit simulator.

BACKGROUND ART

Capacitors are one of the most fundamental electronic components (circuit elements) in an electronic circuit system, and are widely used in various electronic devices. Use of a computer simulation for precise analysis and design of electronic circuits can eliminate the time required for prototype work and experiments and can therefore greatly reduce the design cycle time of electronic devices. To do so, however, a highly accurate wide-band equivalent circuit model of the electronic component is required. When a circuit including a capacitor is to be designed using a SPICE simulator, for example, a SPICE model that can accurately indicate characteristics of the capacitor is required.

Due to the presence of various parasitic parameters, frequency characteristics of the impedance of a capacitor and more particularly the frequency characteristics in a high-frequency band become considerably complicated. This makes it very difficult to obtain a highly accurate SPICE model. Specifically, when a DC (direct current) bias is applied to a capacitor (Class2), the characteristics of capacitance and impedance change significantly. Therefore, if circuit analysis or design is performed by using an equivalent circuit with a nominal capacitance value or without a DC bias, it is inevitable that the results thereof greatly differ from the actual circuit characteristics, which may lead to a complete failure of the design of the electronic device. From this perspective, it is important to construct a SPICE model for a capacitor (Class2) with a DC bias applied thereto that can be suitably used for detailed analysis and design of a circuit, and to establish analysis and design methods utilizing the model.

The following Non-Patent Documents, for example, disclose such equivalent circuits for a capacitor. First, Non-Patent Document 1 discloses equivalent circuits for a multi-layer chip capacitor (MLCC) and a tantalum electrolytic capacitor by John D. Prymak. FIG. 18A shows one of such circuits. In this equivalent circuit, the characteristics changes due to frequencies are taken into account only for an equivalent series resistance ESR. Although other elements are also affected by frequencies, the characteristics changes are not taken into account. Further, the characteristics changes due to frequencies in the equivalent series resistance ESR are calculated by estimate equations that lack a valid theoretical basis. With regard to changes in circuit elements caused by the DC bias, only the equivalent series resistance ESR and a capacitance element Cnom are taken into account, and the characteristics changes in the circuit elements caused by the DC bias are calculated by estimate equations that lack a valid theoretical basis.

Non-Patent Document 2 describes an equivalent circuit disclosed by Brian Hirasuna and Coby Bassett. Here, a SPICE model of a nonlinear capacitor is configured by employing an idealized C circuit model based on an ABM (Analog Behavioral Modeling) function of a SPICE simulator. As shown in FIG. 18B, the capacitor is replaced with a voltage dependent current source. An output current "i" of the voltage dependent current source is expressed by a product of the time derivative of a voltage applied across the capacitor and the capacitance as shown in the figure. A change in the capacitance caused by the voltage is represented by a table (voltage-capacitance) or a polynomial.

RELATED ART DOCUMENTS

Non-Patent Documents

Non-Patent Document 1: John D. Prymak, "SPICE Modeling of Capacitors", CARTS—1995, Components Technology Institute, Inc.

Non-Patent Document 2: Brian Hirasuna, Coby Bassett, "A Nonlinear Capacitor Model for Use in PSpice", OrCAD Technical Support, April 1999

SUMMARY OF THE INVENTION

Problems to be Solved by the Invention

However, the above-mentioned background art has the following disadvantages. First, the equivalent circuit described in Non-Patent Document 1 has frequency-dependent circuit elements, and therefore, the circuit cannot be incorporated into a SPICE simulator directly. Before incorporating this equivalent circuit into a SPICE simulator, the values of the circuit elements that change due to frequency, temperature, and DC bias need to be calculated for different frequencies, temperatures and DC biases using MathCad by Mathsoft, and thereafter an ASCII table (a table showing a relationship between circuit elements and frequencies, temperatures, and voltages) needs to be generated. This makes the equivalent circuit very inconvenient to use.

John D. Prymak, for the first time, took into account the effects of temperatures and DC Bias conditions, with respect to the above-mentioned equivalent circuit proposed by himself, and calculated the characteristics changes in the circuit elements caused by the DC bias and temperatures using estimate equations. However, like the equivalent circuit that is dependent on frequency, the estimate equations lack a valid theoretical basis, and therefore, the equivalent circuit is inconvenient to use as well.

The above-mentioned equivalent circuit described in Non-Patent Document 2 employs an idealized capacitor, and the configuration thereof is so simplified that it results in a significant error. Also, the voltage applied across a capacitor generally includes not only a DC bias, but also various signal voltages and noise voltages that change constantly. Therefore, the change in the capacitance caused by the voltage applied across the capacitor in this circuit differs from the change that would be caused by an actual voltage, and the SPICE model cannot be directly used as a DC bias SPICE model for a capacitor. Thus, the application of the equivalent circuit by Brian Hirasuna and Coby Bassett to the SPICE model of a voltage-controlled capacitor is very limited.

The present invention was made in view of these problems, and it is an object of the present invention to accurately represent characteristics changes caused by a DC bias of a capacitor. Another object of the present invention is to suitably perform a simulation of a circuit including a capacitor with a DC bias applied thereto.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect of the present invention, a method of constructing a circuit simulation model for a capacitor having a DC bias applied thereto includes steps of: configuring a basic equivalent circuit for the capacitor; deriving a circuit equation for a voltage and a current based on the configured basic equivalent circuit; obtaining a characteristics change in circuit elements included in the basic equivalent circuit caused by a DC bias by actual measurement; expressing the obtained characteristics change in the circuit element in terms of a polynomial, and replacing the corresponding circuit element with a nonlinear voltage dependent voltage source defined by the polynomial; constructing a calculation circuit that extracts a component of the DC bias from a voltage applied across the capacitor using a low-pass filter or the like, supplies the DC bias component to the nonlinear voltage dependent voltage source, and performs calculation of the circuit equation based on an output voltage of the nonlinear voltage dependent voltage source; and applying the voltage applied to the capacitor to the calculation circuit through a linear voltage dependent voltage source.

In another aspect, the present invention provides a circuit simulation method that performs a simulation of a circuit that includes a capacitor by using the circuit simulation model constructed by the aforementioned method of constructing a circuit simulation model for a capacitor. In another aspect, the present invention provides a circuit simulator that includes a simulation program that performs a simulation of a circuit that includes a capacitor by using the circuit simulation model constructed by the aforementioned method of constructing a circuit simulation model for a capacitor.

In another aspect, the present invention provides a circuit simulation model for a capacitor having a DC bias applied thereto, including: a nonlinear voltage dependent voltage source that replaces a circuit element included in a prescribed basic equivalent circuit of the capacitor, the non-linear voltage dependent voltage source being defined by a polynomial that represents characteristics change caused by a DC bias in the circuit element measured by actual measurement; a filter (low-pass filter) that extracts a DC bias component from a voltage applied to the capacitor and that supplies the DC bias component to the nonlinear voltage dependent voltage source; a calculation circuit that performs calculation of a circuit equation for a voltage and a current that are derived based on the basic equivalent circuit, by utilizing a respective output voltage of the nonlinear voltage dependent voltage source; and a linear voltage dependent voltage source that couples the voltage applied to the capacitor to the calculation circuit.

In another aspect, the present invention provides a method of constructing a circuit simulation model for a capacitor having a capacitance that depends on an amount of a DC component of a voltage applied across the capacitor, the method including steps of: configuring an equivalent circuit for the capacitor, the equivalent circuit containing at least one element characteristics of which depend on the DC component of the voltage applied across the capacitor; deriving a set of circuit equations governing the configured equivalent circuit; determining a characteristics change due to the DC component in the at least one element; approximating the determined characteristics change due to the DC component by a truncated polynomial for each of the at least one circuit elements; representing each of the at least one circuit element by a nonlinear voltage dependent voltage source defined by the corresponding polynomial; and constructing a calculation circuit that extracts the DC component from the voltage applied across the capacitor, that supplies the extracted DC to the respective nonlinear voltage dependent voltage source, and that solves the set of circuit equations by utilizing an output voltage from the respective nonlinear voltage dependent voltage source.

According to the present invention, a calculation circuit to solve a circuit equation is constructed by configuring a basic equivalent circuit for a capacitor and replacing circuit elements included in the basic equivalent circuit with nonlinear voltage dependent voltage sources. This makes it possible to accurately represent the characteristics of a capacitor having a DC bias applied thereto, thereby realizing an accurate and suitable implementation of circuit design and the like of electronic devices that use capacitor products.

It is to be understood that both the foregoing general description and the following detailed description are exemplary and explanatory, and are intended to provide further explanation of the invention as claimed.

DETAILED DESCRIPTION OF EMBODIMENTS

Figure 1A:
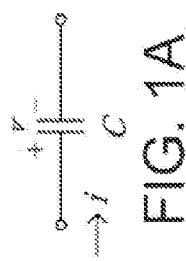
FIG. 1A shows an idealized C circuit model.

Various modes of the present invention will be explained in detail below with reference to embodiments. First, the basic principle of the present invention will be explained. In constructing a SPICE model for a capacitor (Class2) having a DC bias applied thereto, a basic equivalent circuit of the capacitor is first defined. Next, based on the basic equivalent circuit, a circuit equation or a set of equations for a voltage and a current is derived, and an electric current through the capacitor is obtained by configuring a calculation circuit and by solving the circuit equation or set of equations by the calculation circuit. Thereafter, by utilizing ABM function of a SPICE simulator, the capacitor is replaced with a linear voltage dependent current source. The output current of the linear voltage dependent current source is same as the current through the capacitor.

The calculation circuit is mainly constituted of non-standard devices of the SPICE simulator, such as a differentiator, a multiplier, a divider, and an adder that respectively perform differentiation, multiplication, division, addition, and the like, and other standard components of the SPICE simulator. The differentiator, the multiplier, the divider, and the adder are defined by utilizing prescribed functions (or standard devices) of the SPICE simulator as well as various operators, such as addition, multiplication, and division, through construction of Arbitrary Behavioral Voltage Sources, and various operations in the circuit equation are performed by these devices.

For convenience, the inputs and outputs of all of the devices in the calculation circuit, such as the differentiator, the multiplier, the divider, and the adder, handle voltages only. Therefore, respective circuit elements in the circuit equation or a set of equations are converted to respective nonlinear voltage dependent voltage sources, and a unit resistance of 1(Ω) is applied to both ends of the circuit equation that includes currents so that the currents in the equation are converted to corresponding voltages.

The characteristics changes in the respective circuit elements caused by a DC bias are obtained by actual measurement, and are represented by polynomials, respectively. Respective nonlinear voltage dependent voltage sources are defined by the corresponding polynomials. The voltage applied across the capacitor is a complex signal voltage source that includes a DC bias and that constantly changes. The voltage is coupled to the calculation circuit by the linear voltage dependent voltage source of the SPICE simulator while passing through a low-pass filter having a very low cut-off frequency, thereby obtaining a DC bias. The linear voltage dependent current source that replaces the capacitor is controlled by an output voltage of a node in the calculation circuit. The output voltage of this node equals a product of the current through the capacitor and the unit resistance.

Four types of equivalent circuits for a capacitor (Class2) having a DC bias applied thereto and their SPICE models will be explained below, respectively. The four types of equivalent circuits of the capacitor are as follows:

(a) Idealized C circuit model;
(b) RC circuit model;
(c) RLC circuit model; and
(d) High-accuracy wide-band equivalent circuit model that is used for MLCC (multi-layer chip capacitor).

The accuracy of the SPICE model of the capacitor (Class2) having a DC bias applied thereto depends on the basic equivalent circuit employed. The accuracy of the idealized C model and the RC circuit model is satisfactory only at certain frequencies (generally, 1 kHZ or 120 Hz). The RLC circuit model is capable of representing the resonance frequency characteristics of impedance, but the accuracy of the basic equivalent circuit is low, and particularly, it is not capable of representing the frequency characteristics of resistance. Therefore, the satisfactory accuracy cannot be achieved for a wide frequency band. In contrast, when a high-accuracy wide-band equivalent circuit for MLCC is used, the MLCC SPICE model with the DC bias being applied can achieve excellent accuracy.

Embodiment 1

First, the case of the idealized C circuit model will be explained. As shown in FIG. 1A, in the idealized C circuit model of the capacitor, an equivalent circuit is constituted of one circuit element, which is a capacitance element C. Generally, a nominal capacitance is used in this case. In the same figure, "v" denotes a total voltage applied across the capacitor, which equals a voltage across both ends of the capacitance element C. A current through the capacitor is denoted by "i", which equals a current through the capacitance element C. The impedance characteristics represented by the idealized C circuit differ so significantly, especially in a high frequency band, from those in an actual product that the model cannot be suitably used for a circuit design and simulation. However, the idealized C circuit model can be conveniently used in an early stage of the circuit design or for predicting the circuit characteristics.

The voltage "v" applied across the capacitance element C includes various signals and noise that constantly change, in addition to the DC bias voltage. That is, the voltage "v" is expressed by the following Formula 1.

$$v = v_{ac} + V_{dc} \quad \text{Formula 1}$$

In Formula 1, $v_{ac}$ is signal voltages and noise voltages applied across the capacitance element C that constantly change, and $V_{dc}$ is a DC bias voltage applied across the capacitance element C.

The characteristics change in the capacitance element C caused by the DC bias $V_{dc}$ is obtained by actual measurement, and is expressed by a polynomial such as Formula 2 below where $C_0, C_1, C_2, \ldots$, denote coefficients of the polynomial, which are measured in (F), (F/V), (F/V$^2$), $\ldots$, respectively.

$$C = C(V_{dc}) = C_0 + C_1 V_{dc} + C_2 V_{dc}^2 + C_3 V_{dc}^3 + C_4 V_{dc}^4 + C_5 V_{dc}^5 + C_6 V_{dc}^6 + \quad \text{Formula 2}$$

Generally, the current "i" through the capacitance element C is obtained by the following Formula 3.

$$i = C(V_{dc}) dv/dt \quad \text{Formula 3}$$

Formula 3 is a circuit equation of FIG. 1A. This circuit equation is solved by configuring a calculation circuit shown in FIG. 1B. First, the capacitance element C in FIG. 1A is converted to a nonlinear voltage dependent voltage source UA3 that is controlled by the DC bias voltage $V_{dc}$. An output voltage EC of the nonlinear voltage dependent voltage source UA3 is expressed by the following Formula 4.

$$EC = \gamma_C \times C(V_{dc}) \quad \text{Formula 4}$$

In the formula, $\gamma_c$ denotes a capacitance-voltage conversion coefficient that converts the capacitance element C to the nonlinear voltage dependent voltage source UA3, and is measured in (V/F). When Formula 5 is defined as follows, the following Formula 6 is derived from Formula 4.

$$EC_n = \gamma_C \times C_n, n=0,1,2, \quad \text{Formula 5}$$

$$EC = EC_0 + EC_1 V_{dc} + EC_2 V_{dc}^2 + EC_3 V_{dc}^3 + EC_4 V_{dc}^4 + EC_5 V_{dc}^5 + EC_6 V_{dc}^6 + \quad \text{Formula 6}$$

Figure 1B:
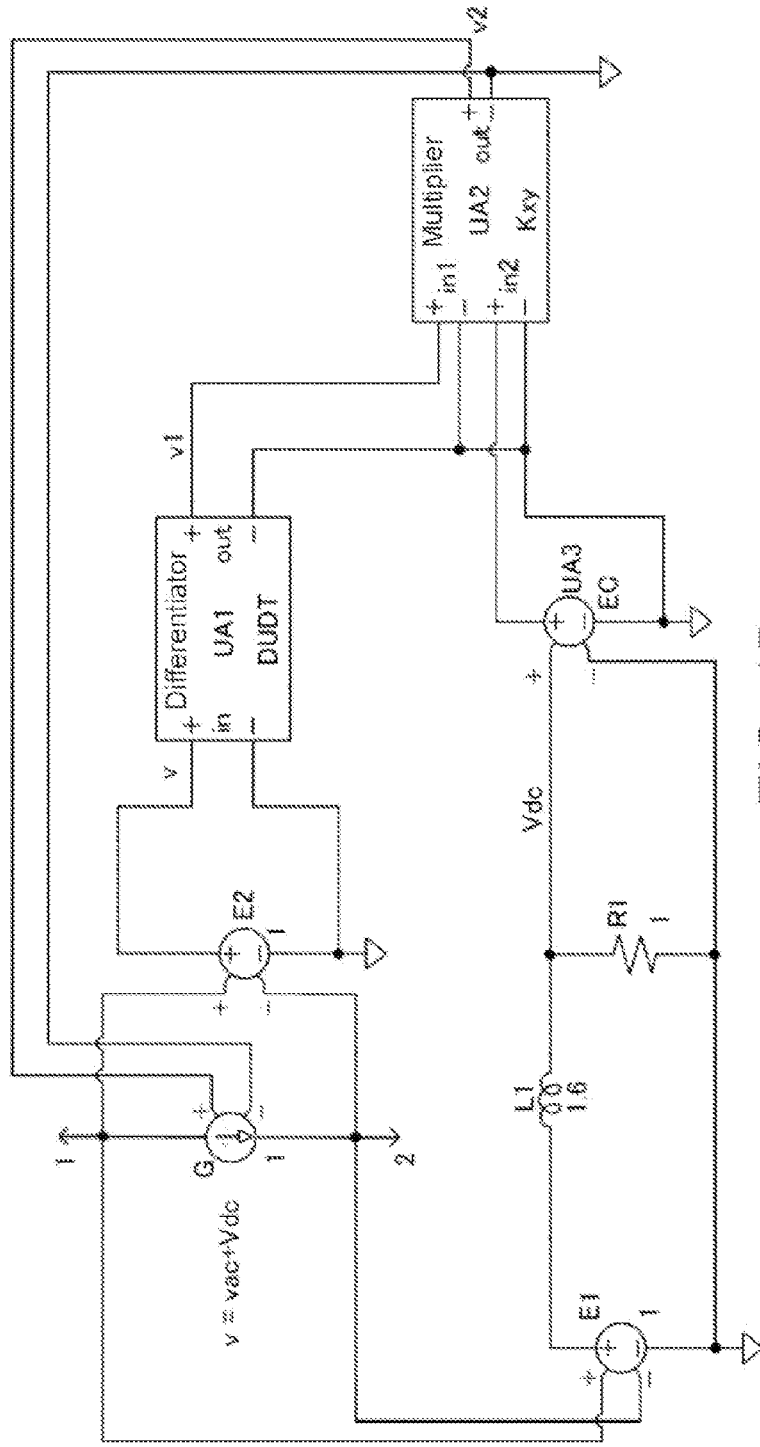
FIG. 1B shows a SPICE model thereof according to Embodiment 1 of the present invention.

The total voltage "v" applied across the capacitor goes through a linear voltage dependent voltage source E1 having a voltage gain of "1" in FIG. 1B, and passes through a low-pass filter (L1 and R1) having a very low cut-off frequency so as to obtain $V_{dc}$. On the other hand, through a linear voltage dependent voltage source E2 having a voltage gain of "1", the total voltage "v" is supplied to an input terminal of a differentiator UA1 and differentiation is performed there. An output voltage v1 of the differentiator UA1 can be obtained by Formula 7 below where β is a voltage conversion coefficient of the differentiator UA1 (measured in (s)).

$$v_1 = \beta \, dv/dt \quad \text{Formula 7}$$

The output voltage v1 of the differentiator UA1 and the output voltage EC of the nonlinear voltage dependent voltage source UA3, which replaces the capacitance element C, are input into the input terminals of a three-port multiplier UA2, respectively, which then performs multiplication. The result of the multiplication is output through output terminals of the multiplier UA2. The output voltage v2 is obtained by Formula 8 below where α is a voltage conversion coefficient of the multiplier UA2 (measured in $(v^{-1})$).

$$v_2 = \alpha \times EC \times v_1 = \alpha \times \gamma_C (V_{dc}) \times \beta \times dv/dt \quad \text{Formula 8}$$

If all of the voltage conversion coefficients $\gamma_c$, α, and β of the respective devices are the unit conversion coefficient "1", the output voltage $v_2$ of the multiplier UA2 becomes equal to a product of the current "i" through the capacitor and the unit resistance. Therefore, the capacitor is replaced with a linear voltage dependent current source G controlled by the voltage $v_2$. The output current "i" of the linear voltage dependent current source G is expressed by Formula 9 below where "g" is the transconductance(measured in (S)). When the transconductance "g" is 1 (S), the output current "i" of the linear voltage dependent current source G becomes the current obtained by Formula 3 above.

$$i = g v_2 \quad \text{Formula 9}$$

Various filters known in the art can be used as the low-pass filter that extract the DC bias voltage $V_{dc}$. In FIG. 1B, an RL circuit, which has a simplest configuration, is used. In designing the low-pass filter constituted of an inductor $L_1$ and a resistance $R_1$ shown in FIG. 1B, a time constant of the circuit need to be taken into account, in addition to the cut-off frequency. In particular, when the input signal includes a square wave that has stepwise change characteristics, a transient phenomenon is generated in the circuit, and it generally takes the circuit five times as long as the time constant to reach a constant state. Therefore, in order to reduce the time required for the circuit to reach the constant state, it is preferable to design the RL low-pass filter so as to have a small time constant. A relationship between a cut-off frequency $f_c$ and a time constant t of the RL low-pass filter is represented by the following Formula 10.

$$f_c = \frac{R_1}{2\pi L_1} \quad \text{Formula 10}$$

$$\tau = \frac{L_1}{R_1}$$

$$f_c \tau = \frac{1}{2\pi}$$

According to Formula 10, if a circuit has a low cut-off frequency $f_c$, the time constant τ thereof becomes great. Thus, in order to make the time constant τ small, the cut-off frequency $f_c$ of the circuit needs to be increased. There exists a trade-off between the two. In designing the low-pass filter, first, the cut-off frequency $f_c$ and the time constant τ are appropriately determined based on the condition of the actual voltage applied across the capacitor, and more particularly, by the smallest period of the square wave having the stepwise change characteristics, and then, by utilizing Formula 10 above, the circuit constants $L_1$ and $R_1$ of the low-pass filter are determined. If the square wave signal changes rapidly and has a shorter period, the transient phenomenon occurs in the capacitor itself as well. Therefore, a basic wave component and other high-order wave components of the square wave signal can be removed and only a direct-current component can be extracted. When the square wave signal changes slowly and has a longer period, it is necessary to maintain change characteristics between high and low voltages of the square wave signal. In this case, the cut-off frequency $f_c$ of the RL low-pass filter needs to be increased properly.

The following Formula 11 shows a design example of the RL low-pass filter.

$$R_1 = 1\Omega \; L_1 = 1.6 \text{ H} f_c \approx 100 \text{ mHz} \; \tau = 1.6 \text{ s} \quad \text{Formula 11}$$

According to this example, it takes about 8(s) for the circuit to settle to a constant state. This low-pass filter is a first order low-pass filter. When the filtering is not effective enough, and the output direct current has a ripple component, one or two RL low-pass filters need to be added after the first order filter as a second order filter (and a third order filter).

The linear voltage dependent voltage sources E1 and E2 and the linear voltage dependent current source G in the circuit shown in FIG. 1B are all standard devices of a SPICE simulator. On the other hand, the differentiator UA1 (the model name is DUDT) and the multiplier UA2 (the model name is Kxy) are not the standard devices of the SPICE simulator. However, they can be defined by utilizing prescribed function ddt( ) of the SPICE simulator as well as various operators through construction of Arbitrary Behavioral Voltage Sources. SpiceFile 1 below is a SPICE file of the differentiator UA1. The respective voltage conversion coefficients are the unit voltage conversion coefficient and therefore not shown.

*SpiceFile1:DUDT.sub
*The SpiceFile1 (DUDT.sub) defines a differential operator with 2 ports.
.SubCkt DUDT 1 2 3 4
B 3 4 V=ddt(V(1,2))
.ends DUDT A SPICE file of the multiplier UA2 is as follows (SpiceFile2).

*SpiceFile2:Kxy.sub
*The SpiceFile2 (Kxy.sub) defines a 3-port Multiplier.
.SubCkt Kxy 1 2 3 4 5 6
B 5 6 V=V(1,2)*V(3,4)
.ends Kxy The nonlinear voltage dependent voltage source EC, which corresponds to the capacitance element C, is defined by the SPICE simulator in a manner similar to above. The following SpiceFile3 is the SPICE file thereof.
*SpiceFile3:EC.sub
*The SpiceFile3 defines a non-linear Voltage Dependent Voltage Source instead of*
*circuit element C.
.SubCkt EC 1 2 3 4
EC 1 2 POLY(1) (3, 4) EC0 EC1 EC2 EC3 EC4 EC5 EC6 . .
.
.ends EC FIG. 1B is a SPICE model for a capacitor (Class2) with a DC bias applied thereto when the idealized C circuit model is employed. The following SpiceFile4 is a SPICE file of this SPICE model.
*SpiceFile4:Cap_Class2_DCBias_Model1.sub
*SpiceFile4 is the spice model (Model 1) for the DC bias characteristic
*of the capacitor (Class2). The ideal capacitance model C is used.
.SubCkt Cap_Class2_DCBias_Model1 1 2
L1 7 8 1.6
R1 8 0 1
E1 7 0 1 2 1
XU3 6 0 8 0 EC
E2 3 0 1 2 1
G 2 1 5 0 1
XU2 4 0 6 0 5 0 Kxy
XU1 3 0 4 0 DUDT
.ends Cap_Class2_DCBias_Model1

Figure 2A:
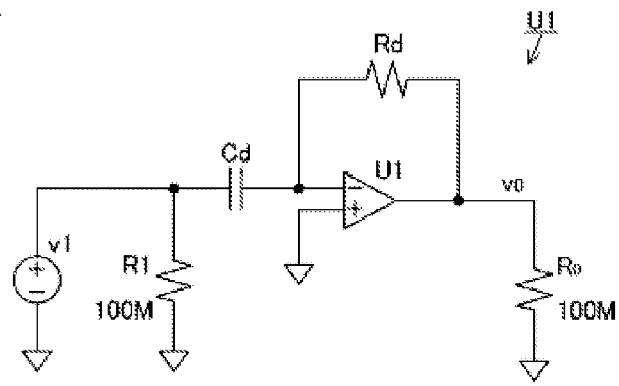
FIGS. 2A-2C are circuit diagrams illustrating details of the SPICE model of Embodiment 1.

The prescribed function ddt( ) that executes the differentiation may not be provided in some SPICE simulators. In such a case, a differentiator circuit constituted of an idealized operational amplifier shown in FIG. 2A can be used as a substitute for the differentiator UA1. A relationship between an output voltage $V_O$ and an input voltage $V_1$ of the differentiator circuit shown in FIG. 2A is represented by the following Formula 12.

$$V_O = -C_d R_d dV_1/dt = -\beta dV_1/dt \quad \text{Formula 12}$$

Figure 2B:
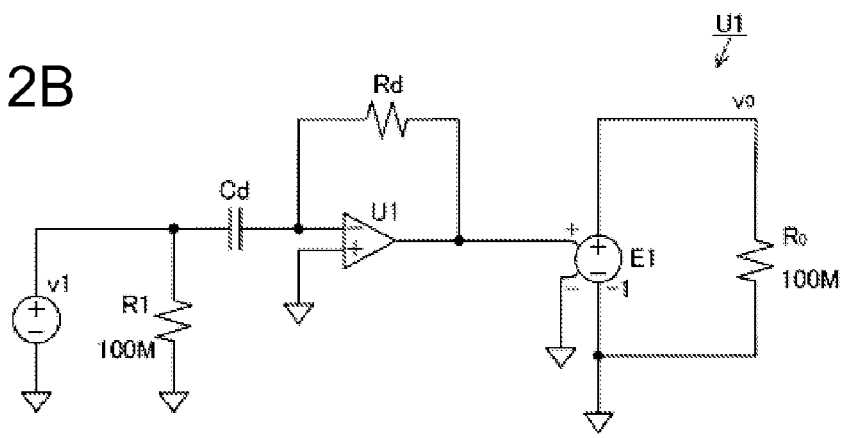

Here, $\beta = C_d R_d$ is the voltage conversion coefficient of the differentiator circuit. According to this Formula 12, the polarities of the output voltage $V_O$ and the input voltage $V_1$ of the differentiator circuit become opposite to each other. To solve this problem, a linear voltage dependent voltage source having the voltage gain of "−1" is added to the output terminal of the circuit shown in FIG. 2A. FIG. 2B shows a circuit after the addition. The output voltage $V_O$ of the circuit shown in FIG. 2B is expressed by Formula 13 below. A voltage conversion coefficient $\beta$ of the differentiator circuit is determined by the resistance Rd and the capacitor $C_d$. When $R_d=1(\Omega)$ and $C_d=1(F)$, the voltage conversion coefficient $\beta$ of the differentiator circuit becomes $\beta=1(s)$.

$$V_O = \beta dV_1/dt \quad \text{Formula 13}$$

Figure 2C:
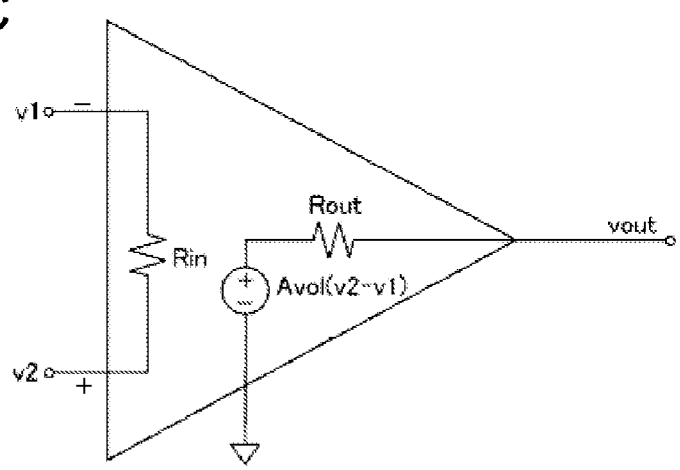

FIG. 2C shows an example of an equivalent circuit of the idealized operational amplifier in the equivalent circuits shown in FIGS. 2A and 2B. Resistances Rin and Rout are an input resistance and an output resistance of the idealized operational amplifier, respectively. Avol is an open loop gain of the idealized operational amplifier. In the idealized operational amplifier, values of the loop gain Avol and the input resistance Rin are both infinite, and a value of the output resistance Rout is zero. Therefore, in order to maintain the accuracy of the differentiator circuit, it is necessary to make the input resistance Rin and the open loop gain Avol of the idealized operational amplifier as high as possible, and the output resistance Rout as small as possible. The open loop gain Avol is associated with the applied frequency range of the differentiator circuit. The respective values are set as follows: Rout=0($\Omega$); Rin=100(M$\Omega$); and Avol=10000(G) so that the differentiator circuit becomes sufficiently accurate, and the applied frequency range reaches at least 100(GHz). SpiceFile 5 below is an example of a SPICE file of the idealized operational amplifier represented by the equivalent circuit of FIG. 2C (The model name is "opamp").
*SpiceFile5: opamp.sub
*The SpiceFile5 defines a idealized operational amplifier.
.SubCkt opamp 1 2 3
Rin 1 2 100 meg
E1 3 0 2 1 10000G
.ends opamp The following Spicefile6 is an example of a SPICE file of the differentiator circuit shown in FIG. 2B (the model name is DUDTopamp).
*SpiceFile6: DUDTopamp.sub
*The SpiceFile6 is a differential circuit constructed by an opamp and
*a linear Voltage-dependent Voltage-sources circuit element.
.include opamp.sub
.SubCkt DUDTopamp 1 2 3 4
R1 1 2 100 meg
Cd 1 5 1
Rd 5 6 1
XU1 5 0 6 opamp
E1 3 4 6 0 −1
Ro 3 4 100 meg
.ends DUDTopamp As described above, according to the present embodiment, a simulation circuit of the SPICE model is configured by the following method:

(1) Configuring an idealized C circuit model as a basic equivalent circuit for a capacitor;

(2) Deriving a circuit equation for a voltage and a current based on the idealized C circuit model;

(3) Defining respective operational devices, and configuring a calculation circuit that performs calculation of the aforementioned circuit equation by using the operation devices;

(4) Obtaining characteristics changes in a capacitance element caused by a DC bias by actual measurement, expressing the characteristics changes in terms of a polynomial, and replacing the capacitance element with a nonlinear voltage dependent voltage source;

(5) Applying the voltage applied across the capacitor to the calculation circuit through two linear voltage dependent voltage sources; and (6) Extracting a DC bias component from the applied voltage using a low-pass filter that has a very low cut-off frequency, and applying the DC bias component to the nonlinear voltage dependent voltage source.

This makes it possible to provide the SPICE model that is suitably used for circuit design, characteristics evaluation, failure analysis, and the like of an electronic device that uses a capacitor product.

Embodiment 2

Figures 3A, 3B:
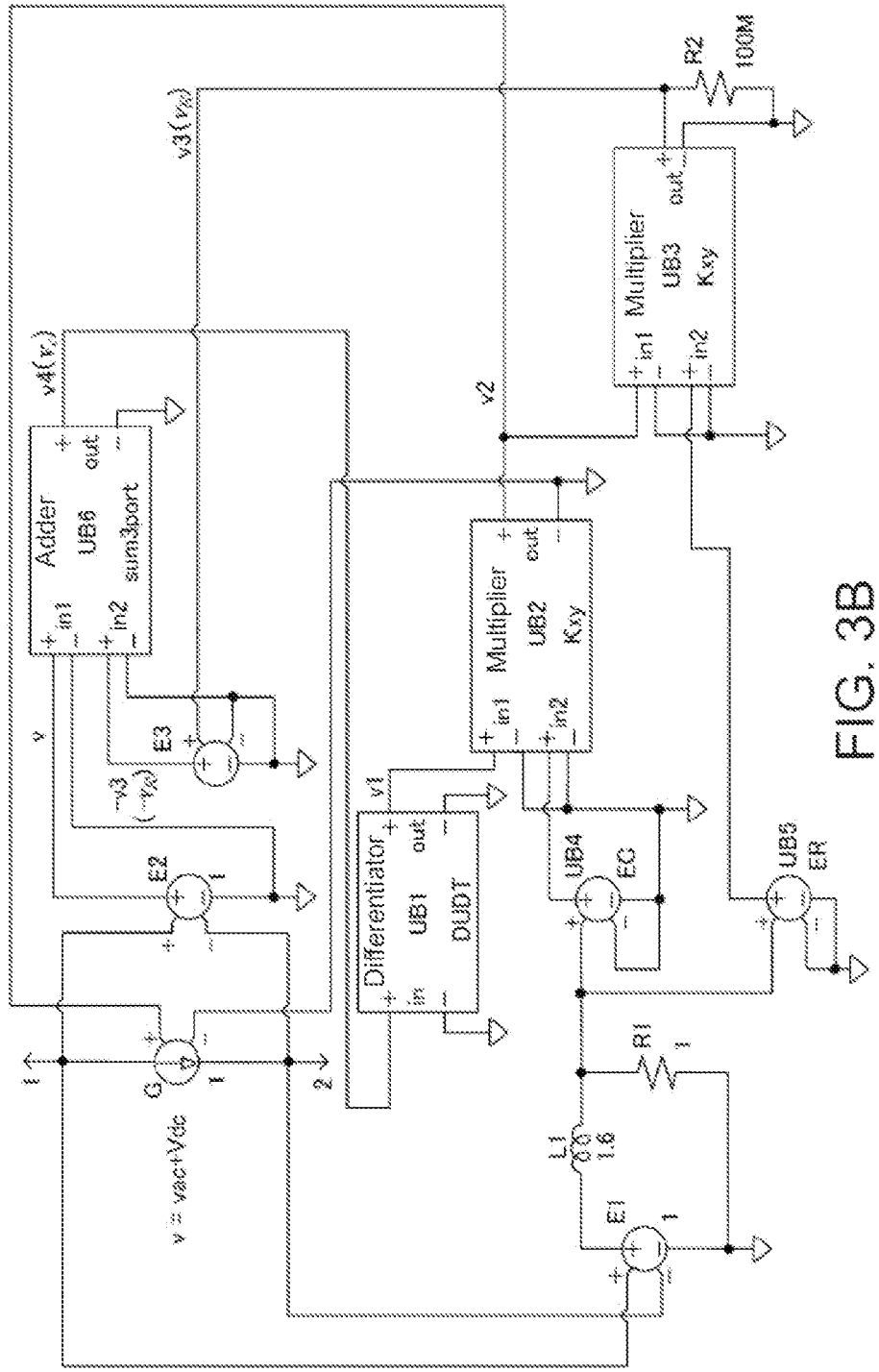
FIGS. 3A-3B are circuit diagrams illustrating an RC circuit model of Embodiment 2 of the present invention and a SPICE model thereof.

Next, the case of an RC circuit model will be explained. When the loss due to a resistance needs to be taken into account, a series resistance is added to the idealized C circuit. FIG. 3A shows a circuit configuration of the RC circuit model. A capacitance element C is a nominal capacitance. A resistance element R is derived from a dielectric loss tangent Tan $\delta$ that is obtained by the same measurement frequency and measurement voltage as those of the idealized C circuit.

This equivalent circuit has the same level of accuracy as that of the idealized C circuit model, and is only used in an early stage of circuit design or for predicting circuit characteristics. In FIG. 3A, $V_C$ denotes a voltage applied across the capacitance element C. $V_R$ denotes a voltage applied across the resistance element R, and "i" denotes a current through the capacitor. The total voltage V applied to the capacitor is equal to the sum of the aforementioned $V_C$ and $V_R$, which is expressed by the following Formula 14.

$$v = v_C + v_R = v_{ac} + V_{dc} \qquad \text{Formula 14}$$

In a capacitor (Class2), characteristics of the capacitance element C and the resistance element R in the equivalent circuit of FIG. 3A are changed due to a DC bias voltage. The changes in the characteristics can be obtained by actual measurement, and are expressed by polynomials. The capacitance element C is expressed by the above-mentioned Formula 2. The resistance element R can also be expressed by a formula in the same form. For convenience, an element X is used to represent a given circuit element in the equivalent circuit. In a manner similar to above, the element X is affected by a DC bias voltage $V_{dc}$, and the characteristic change is expressed by a polynomial. Generally, it is expressed by the following Formula 15.

$$X = X(V_{dc}) = X_0 + X_1 V_{dc} + X_2 V_{dc}^2 + X_3 V_{dc}^3 + X_4 V_{dc}^4 + X_5 V_{dc}^5 + X_6 V_{dc}^6 + \qquad \text{Formula 15}$$

In Formula 15, X0, X1, X2, ..., are respective coefficients of the polynomial. The coefficients for capacitance element C are expressed in the unit of (F), (F/V), (F/V$^2$), ..., and the coefficients for resistance element R are expressed in the unit of ($\Omega$), ($\Omega$/V), ($\Omega$/V$^2$), .... When the circuit element X is converted to a nonlinear voltage dependent voltage source that is controlled by a DC bias voltage, an output voltage EX of the nonlinear voltage dependent voltage source is expressed by the following Formula 16.

$$EX = \gamma_X \times X(V_{dc}) \qquad \text{Formula 16}$$

In Formula 16, $\gamma_X$ is a voltage conversion coefficient. With respect to the capacitance element C, $\gamma_X = \gamma_C$ is a capacitance-voltage conversion coefficient and is expressed in (V/F). With respect to the resistance element R, $\gamma_X = \gamma_R$ is a resistance-voltage conversion coefficient and is expressed in (V/$\Omega$). When Formula 17 is defined as follows, Formula 18 below is derived from Formula 16 above.

$$EX_n = \gamma_X X_n, n = 0, 1, 2, \qquad \text{Formula 17}$$

$$EX = EX_0 + EX_1 V_{dc} + EX_2 V_{dc}^2 + EX_3 V_{dc}^3 + EX_4 V_{dc}^4 + EX_5 V_{dc}^5 + EX_6 V_{dc}^6 + \qquad \text{Formula 18}$$

A SPICE file of the nonlinear voltage dependent voltage source EX is represented by a generalized format such as the following SpiceFle7.

*SpiceFile7: EX.sub
*The SpiceFile7 defines a generalized non-linear Voltage Dependent Voltage
*Source instead of any circuit element X in the equivalent circuit.
.SubCkt EX 1 2 3 4
EX 1 2 POLY(1) (3, 4) EX0 EX1 EX2 EX3 EX4 EX5 EX6
.ends EX The circuit of FIG. 3A can be expressed by a circuit equation in the following Formula 19.

$$v = v_C + v_R = v_C + R(V_{dc}) i$$

$$i = C(V_{dc}) dv_C/dt \qquad \text{Formula 19}$$

In this Formula 19, an amount of the total voltage "v" applied across the capacitor is known, and an amount of the voltage $v_C$ of the capacitance element C is unknown. Formula 19 can be rewritten as follows (Formula 20).

$$v_C = v - v_R = v - R(V_{dc}) i$$

$$v_C = v - R(V_{dc}) C(V_{dc}) dv_C/dt \qquad \text{Formula 20}$$

This is a first order differential equation for the voltage $v_C$ of the capacitance element C. This circuit equation can be solved by constructing one negative feedback circuit shown in FIG. 3B. The circuit in FIG. 3B is constructed by adding a nonlinear voltage dependent voltage source UB5, which replaces the resistance element R, and an adder UB6 to the above-mentioned circuit shown in FIG. 1B. This negative feedback circuit employs two multipliers UB2 and UB3, and three linear voltage dependent voltage sources E1, E2, and E3. According to the calculation circuit in FIG. 3B, the voltage $v_C$ of the capacitance element C is applied to the differentiator UB1, which then performs differentiation. An output voltage $v_1$ of this differentiator UB1 is therefore expressed by the following Formula 21.

$$V_1 = \beta dV_C/dt \qquad \text{Formula 21}$$

The output voltage v1 of the differentiator UB1 and an output voltage EC of the nonlinear voltage dependent voltage source UB4, which represents the capacitance element C, are applied to the input terminals of the multiplier UB2, respectively, which then performs multiplication. An output voltage $v_2$ of the multiplier UB2 is therefore expressed by the following Formula 22.

$$v_2 = \alpha \times EC \times v_1 = \alpha \times \gamma_C(V_{dc}) \times \beta \times dv_C/dt \qquad \text{Formula 22}$$

This output voltage $v_2$ of the multiplier UB2 and an output voltage ER of the nonlinear voltage dependent voltage source UB5, which corresponds to the resistance element R, are applied to the input terminals of the second multiplier UB3, respectively, which then performs multiplication. An output voltage $v_3$ of the multiplier UB3 is therefore expressed by the following Formula 23.

$$v_3 = \alpha \times EC \times v_2 = \alpha \times \gamma_R \times R(V_{dc}) \times \alpha \times \gamma_C \times C(V_{dc}) \times dv_C/dt \qquad \text{Formula 23}$$

The output voltage $v_3$ of the multiplier UB3 is provided to a linear voltage dependent voltage source E3 having the voltage gain of "−1" to have its sign reversed, and applied to the input terminal of the adder UB6. The total voltage "v" applied across the capacitor is also provided to the adder UB6, which then performs addition. Here, the total voltage "v" is applied to the input terminal of the adder UB6 through the linear voltage dependent voltage source E2. An output voltage $v_4$ of the adder UB6 is therefore expressed by the following Formula 24.

$$v_4 = v - v_3 = v - \alpha \times \gamma_R \times R(V_{dc}) \times \alpha \times \gamma_C \times C(V_{dc}) \times \beta dv_C/dt \qquad \text{Formula 24}$$

Here, when the voltage conversion coefficients $\alpha$, $\beta$, $\gamma_C$, and $\gamma_R$, of the respective devices are the unit conversion coefficient "1", the following Formula 25 is satisfied.

$$v_5 = v_R \, v_4 = v_C = v - v_R \qquad \text{Formula 25}$$

In the calculation circuit shown in FIG. 3B that includes the adder UB6, the differentiator UB1, the multipliers UB2 and UB3, and other standard components, the output voltage $v_R$ is fed back to an input terminal of the adder UB6 after the sign thereof is reversed by the linear voltage dependent voltage source E3 having the voltage gain of "−1". A feedback circuit is therefore constituted. When response characteristics of the calculation circuit in frequency domain is taken into account, the I/O voltage transfer function $G(\omega)$ of the calculation circuit is defined by the following Formula 26.

$$G(\omega) = \frac{v_R(\omega)}{v(\omega)} \qquad \text{Formula 26}$$

In this Formula 26, the angular frequency $\omega$ of the signal is derived from $\omega=2\pi f$, where "f" is the frequency of the signal. Formula 26 is rewritten as the following Formula 27.

$$\begin{aligned}G(\omega) &= \frac{v_R(\omega)}{v(\omega)} = \frac{v_R(\omega)}{v_C(\omega)}\frac{v_C(\omega)}{v(\omega)} = \frac{v_R(\omega)}{v_C(\omega)}\frac{v(\omega)-v_R(\omega)}{v(\omega)} \qquad \text{Formula 27}\\ &= \frac{v_R(\omega)}{v_C(\omega)}\left(1 - \frac{\omega_R(\omega)}{v(\omega)}\right) = \frac{v_R(\omega)}{v_C(\omega)}(1 - G(\omega))\end{aligned}$$

$$\begin{aligned}v_R(\omega) &= R(V_{dc})i(\omega)\\ &= R(V_{dc})C(V_{dc})dv_C(\omega)/dt\\ &= R(V_{dc})C(V_{dc})j\omega v_C(\omega)\end{aligned}$$

The open loop voltage transfer function $A(\omega)$ of the calculation circuit is defined by the following Formula 28, which is substituted in the above-mentioned Formula 27 to derive Formula 29 below.

$$A(\omega) = \frac{v_R(\omega)}{v_C(\omega)} = j\omega R(V_{dc})C(V_{dc}) \qquad \text{Formula 28}$$

$$G(\omega) = \frac{A(\omega)}{1 + A(\omega)} \qquad \text{Formula 29}$$

From the I/O voltage transfer function $G(\omega)$ in this Formula 29, it is found that the calculation circuit of FIG. 3B is a negative feedback circuit. Also, a relationship expressed by Formula 30 below is satisfied for all frequency bands. Thus, it can be determined that the calculation circuit of FIG. 3B is a stable negative feedback circuit, and this stability of the negative feedback circuit ensures the convergence of the algorithm that solves the differential equation of Formula 20.

$$1+A(\omega)=1+j\omega R(V_{dc})C(V_{dc}) \neq 0 \qquad \text{Formula 30}$$

The capacitor itself is replaced with a linear voltage dependent current source G having the transconductance g=1(S) and controlled by the output voltage $v_2$ of the multiplier UB2. An output current of the linear voltage dependent current source G completely coincides with "i" in Formula 19, which equals the current through the capacitor. The circuit of FIG. 3B becomes a SPICE model for a capacitor (Class2) with a DC bias applied thereto, in which the RC circuit model is employed.

The adder UB6 is not a standard device of the SPICE simulator, and is defined by utilizing operators of the SPICE simulator through construction of an Arbitrary Behavioral Voltage Source. The following SpiceFile8 (a model name is "sum3port") is one example of a SPICE file of the adder UB6.

*SpiceFile8:sum3port.sub
*The SpiceFile8 defines a 3-port adder.
.SubCkt sum3port 1 2 3 4 5 6
B 5 6 V=V(1,2)+V(3,4)
.ends sum3port Also, the following SpiceFile9 shows a SPICE file of a DC bias SPICE model of a capacitor (Class2) that employs the RC equivalent circuit.
*SpiceFile9:Cap_Class2_DCBias_Model2.sub
*SpiceFile9 is the spice model (Model 2) for the DC bias characteristic
*of the capacitor (Class2).
*The RC series equivalent circuit is used.
.SubCkt Cap_Class2_DCBias_Model2 1 2
L1 10 11 1.6
R1 11 0 1
E1 10 0 1 2 1
XU4 9 0 11 0 EC
XU5 12 0 11 0 ER
XU6 3 0 5 0 4 0 sum3port
E2 3 0 1 2 1
XU3 6 0 12 0 7 0 Kxy
G 2 1 6 0 1
XU2 8 0 9 0 6 0 Kxy
XU1 4 0 8 0 DUDT
E3 5 0 7 0 -1
R2 7 0 100 meg
.ends Cap_Class2_DCBias_Model2

As described above, according to the present embodiment, the RC circuit model is used as the basic equivalent circuit for the capacitor, and the resistance element, in addition to the capacitance element, is also replaced with a nonlinear voltage dependent voltage source in constructing the calculation circuit of the circuit equation. This makes it possible to suitably conduct circuit design, characteristics evaluation, failure analysis, and the like of an electronic device that uses a capacitor product in a manner similar to the previous embodiment. In particular, because the present embodiment takes into account the resistance loss, it is more advantageous than the idealized C circuit model of Embodiment 1 in that a loss in the capacitor can be taken into account in predicting circuit characteristics in the early stage.

Embodiment 3

Figures 4A, 4B:
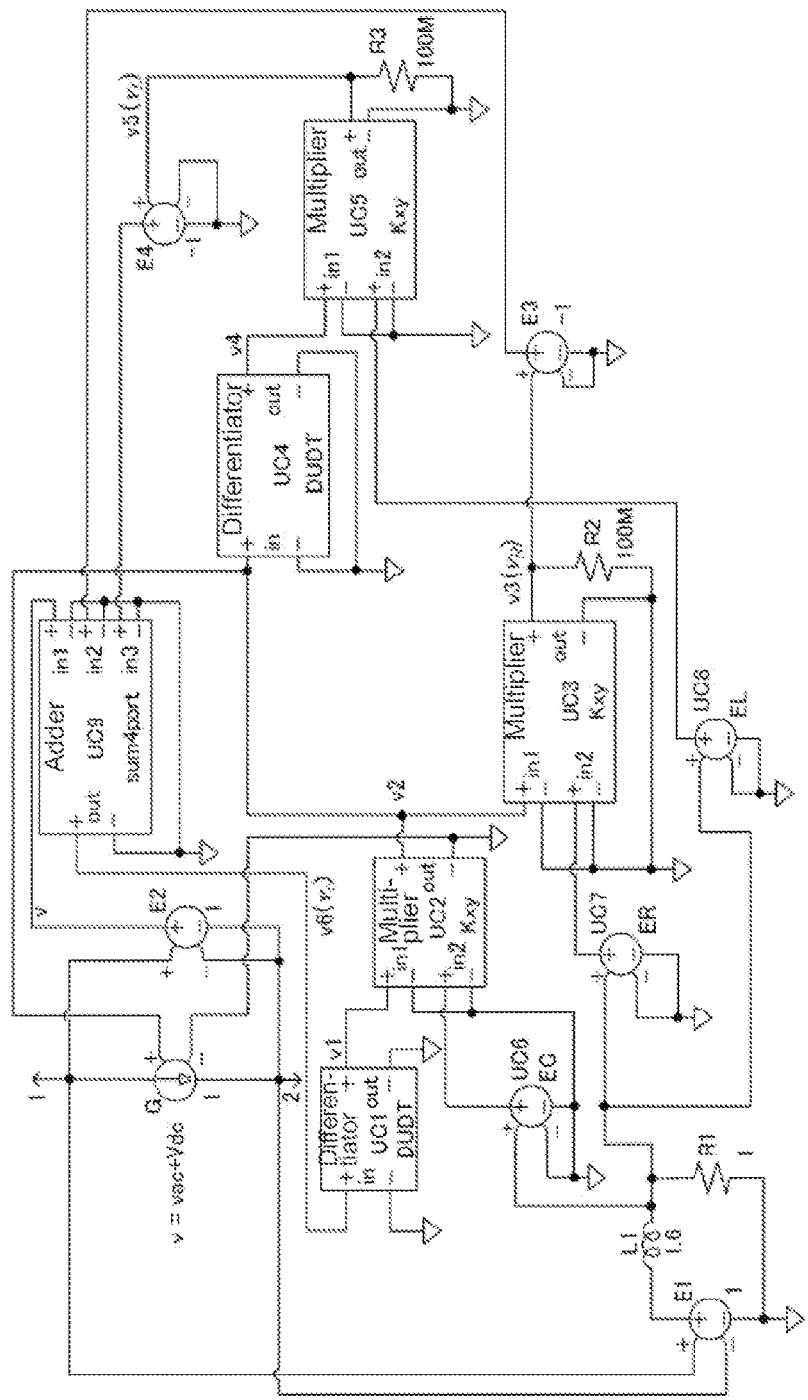
FIGS. 4A-4B are circuit diagrams illustrating an RLC circuit model of Embodiment 3 of the present invention and a SPICE model thereof.

Next, the case of an RLC circuit model will be explained. When the parasitic inductance of the capacitor needs to be taken into account in the above-mentioned RC circuit, an RLC series circuit shown in FIG. 4A is used as an equivalent circuit for the capacitor. The RLC series circuit is the most fundamental and most commonly used equivalent circuit for a capacitor. Because the parasitic inductance is taken into account, frequency characteristics of the impedance of the capacitor, more particularly frequency characteristics of the resonance, are improved in this circuit. In FIG. 4A, $v_C$, $v_L$, and $v_R$ respectively denote voltages of the capacitance element C, the parasitic inductance L, and the resistance element R that are connected in series, and "i" denotes a current through the capacitor. The total voltage "v" applied across the capacitor equals the sum of these $v_C$, $v_L$, and $v_R$, and is expressed by the following Formula 31.

$$v = v_c + v_L + v_R = v_{ac} + V_{dc} \qquad \text{Formula 31}$$

Characteristics of the three circuit elements of the RLC equivalent circuit are changed by the DC bias voltage $V_{dc}$. The characteristics changes are expressed by the above-mentioned polynomial in Formula 15, and are represented by nonlinear voltage dependent voltage sources. The SPICE file of this circuit is the aforementioned SpiceFile7. In FIG. 4A, a circuit equation shown in the following Formula 32 is satisfied.

$$v_C = v - v_L - v_R \; v_L = L(V_{dc})di/dt \; v_R = R(V_{dc})i \; i = C(V_{dc})dv_C/dt \qquad \text{Formula 32}$$

From the equation in Formula 32, the following Formula 33 is derived.

$$v_C = v - L(V_{dc})C(V_{dc})d^2v_C/dt^2 - R(V_{dc})C(V_{dc})dv_C/dt \quad \text{Formula 33}$$

This Formula 33 is a second order differential equation for the voltage $v_C$ of the capacitance element C. Therefore, in a manner similar to the above, the circuit equation is solved by constructing a negative feedback circuit. FIG. 4B shows a circuit configuration of a SPICE model for the RLC equivalent circuit model. As shown in the figure, the circuit includes two differentiators UC1 and UC4, three multipliers UC2, UC3, and UC5, one adder UC9, three nonlinear voltage dependent voltage sources UC6, UC7, and UC8 that replace the circuit elements C, R, and L, respectively. EC, ER, and EL denote output voltages, respectively.

According to the calculation circuit, the voltage $v_C$ of the capacitance element C is differentiated by the first differentiator UC1. The resulting output voltage $v_1$ is expressed by the following Formula 34.

$$v_1 = \beta dv_C/dt \quad \text{Formula 34}$$

The output voltage $v_1$ and the output voltage EC of the nonlinear voltage dependent voltage source UC6 are input into the first multiplier UC2, which then performs multiplication. An output voltage $v_2$ of the multiplier UC2 is therefore expressed by the following Formula 35.

$$v_2 = \alpha \times EC \times v_1 = \alpha \times \gamma_C \times C(V_{dc}) \times \beta dv_C/dt \quad \text{Formula 35}$$

This output voltage $v_2$ of the multiplier UC2 and the output voltage ER of the nonlinear voltage dependent voltage source UC7 are input into the second multiplier UC3, which then performs multiplication. An output voltage $v_3$ of the multiplier UC3 is therefore expressed by the following Formula 36.

$$v_3 = \alpha \times ER \times v_2 = \alpha \times \gamma_R \times R(V_{dc}) \times \alpha \times \gamma_C \times C(V_{dc}) \times \beta dv_C/dt \quad \text{Formula 36}$$

The output voltage $v_2$ of the multiplier UC2 is input into the second differentiator UC4, which then performs differentiation. An output voltage $v_4$ of the differentiator UC4 is therefore expressed by the following Formula 37.

$$v_4 = \beta dv_2/dt = \beta \times \alpha \times \gamma_C C(V_{dc}) \times \beta \times d^2v_C/dt^2 \quad \text{Formula 37}$$

The output voltage $v_4$ of the differentiator UC4 and the output voltage EL of the nonlinear voltage dependent voltage source UC8 are input into the third multiplier UC5, which then performs multiplication. An output voltage $v_5$ of the multiplier UC5 is therefore expressed by the following Formula 38.

$$v_5 = \alpha \times EL \times v_4 = \alpha \times \gamma_L \times L(V_{dc}) \times \beta \times \alpha \times \gamma_C \times C(V_{dc}) \times \beta \times d^2v_C/dt^2 \quad \text{Formula 38}$$

The output voltages $v_3$ and $v_5$ of the multipliers UC3 and UC5 are provided to the linear voltage dependent voltage sources E3 and E4 having the voltage gains "−1" to have the signs thereof reversed, and supplied into the adder UC9, respectively. The total voltage "v" applied across the capacitor is also provided to the adder UC9, which then performs addition. The total voltage "v" is applied to the input terminal of the adder UC9 through the linear voltage dependent voltage source E2. An output voltage $v_6$ of the adder UC9 therefore becomes $v_6 = v - v_3 - v_5$. When the voltage conversion coefficients $\alpha$, $\beta$, $\gamma_C$, and $\gamma_L$ of the respective devices are the unit conversion coefficient "1", $v_3 = v_R$, $v_5 = v_L$, $v_6 = v_C = v - v_R - v_L$ are satisfied, which coincides with the above-mentioned Formula 32.

In the calculation circuit constituted of the differentiators UC1 and UC4, the multipliers UC2, UC3, and UC5, the adder UC9, and other standard components, the two output voltages $v_R$ and $v_L$ are obtained. These two output voltages $v_R$ and $v_L$ are provided to the two linear voltage dependent voltage sources E3 and E4 with the voltage gains "−1" to have the signs thereof reversed, respectively, and fed back to the input terminals of the adder UC9. A feedback circuit is therefore constituted. When response characteristics of the calculation circuit in frequency domain are taken into account, two I/O voltage transfer functions GR($\omega$) and GL($\omega$) are defined by the following Formula 39, respectively.

$$G_R(\omega) = \frac{v_R(\omega)}{v(\omega)} \quad \text{Formula 39}$$
$$G_L(\omega) = \frac{v_L(\omega)}{v(\omega)}$$

Two open loop voltage transfer functions AR($\omega$) and AL($\omega$) are defined by the following Formula 40, respectively.

$$A_R(\omega) = \frac{v_R(\omega)}{v_C(\omega)} \quad \text{Formula 40}$$
$$A_L(\omega) = \frac{v_L(\omega)}{v_C(\omega)}$$

From the above-mentioned formulae, relational expressions of the following Formula 41 are obtained.

$$G_R(\omega) = \frac{A_R(\omega)}{1 + A_R(\omega) + A_L(\omega)} \quad \text{Formula 41}$$
$$G_L(\omega) = \frac{A_L(\omega)}{1 + A_R(\omega) + A_L(\omega)}$$
$$A_R(\omega) = j\omega R(V_{dc})C(V_{dc})$$
$$A_L(\omega) = -\omega^2 L(V_{dc})C(V_{dc})$$

From this Formula 41, it is found that the feedback of the two output voltages $v_R$ and $v_L$ to the input side of the calculation circuit is negative. Also, the following Formula 42 is satisfied for all frequency bands.

$$1 + A_R(\omega) + A_L(\omega) = 1 - \omega^2 L(V_{dc})C(V_{dc}) + j\omega R(V_{dc})C(V_{dc}) \neq 0 \quad \text{Formula 42}$$

Thus, it can be determined that the calculation circuit of FIG. 4B is a stable negative feedback circuit, and therefore, the convergence of the algorithm that solves the circuit equation is ensured. Lastly, the capacitor itself can be replaced with the linear voltage dependent current source G that has the transconductance g=1(S) and that is controlled by the voltage $v_2$. In this way, the SPICE model of the capacitor (Class2) having a DC bias applied thereto is constructed by using the RLC circuit.

The four-port adder UC9 (a model name is sum4port) is a non-standard device of the SPICE simulator, and is defined by a SPICE file SpiceFile10 as follows.

*SpiceFile10: sum4port.sub

*The SpiceFile10 defines a 4-port adder with 3 input ports and 1 output port.

.SubCkt sum4port 1 2 3 4 5 6 7 8

B 7 8 V=V(1,2)+V(3,4)+V(5,6)

.ends sum4port

The following SpiceFile 11 is a SPICE file of the SPICE model for the capacitor (Class2) with a DC bias applied thereto, in which the RLC equivalent circuit is employed.
*SpiceFile11: Cap_Class2_DCBias_Model3.sub
*SpiceFile11 is the spice model (Model 3) for the DC bias characteristic
*of the capacitor (Class2).
*The RLC series equivalent circuit is used.
.SubCkt Cap_Class2_DCBias_Model3 1 2
L1 15 12 1.6
R1 12 0 1
E1 15 0 1 2 1
XU6 16 0 12 0 EC
XU7 14 0 12 0 ER
E2 3 0 1 2 1
XU3 7 0 14 0 13 0 Kxy
G 2 1 7 0 1
XU2 10 0 16 0 7 0 Kxy
XU9 3 0 5 0 6 0 4 0 sum4port
XU5 9 0 11 0 8 0 Kxy
XU8 11 0 12 0 EL
R3 8 0 100 meg
E4 6 0 8 0 −1
XU1 4 0 10 0 DUDT
XU4 7 0 9 0 DUDT
E3 5 0 13 0 −1
R2 13 0 100 meg
.ends Cap_Class2_DCBias_Model3

As described above, according to the present embodiment, the RLC circuit model is used as the basic equivalent circuit for the capacitor, and the resistance element and the inductance element, in addition to the capacitance element, are replaced with nonlinear voltage dependent voltage sources in constructing the calculation circuit of the circuit equation. This makes it possible to suitably conduct circuit design, characteristics evaluation, failure analysis, and the like of an electronic device using a capacitor product in a manner similar to the previous embodiments. In particular, the present embodiment is more advantageous than Embodiment 1 and Embodiment 2 in that the frequency characteristics of the capacitor, more particularly the frequency characteristics of resonance, can be represented with accuracy.

Embodiment 4

Next, the case of a high-accuracy wide-band equivalent circuit model for an MLCC will be explained. The size of electronic devices such as mobile phones is increasingly reduced. An MLCC is one of the electronic components that are useful for the size reduction. Frequency characteristics of the impedance of an MLCC is very complex, and therefore, a high-accuracy SPICE model for an MLCC has been demanded to greatly reduce time required for a detailed design of the electronic device.

Figure 5A:
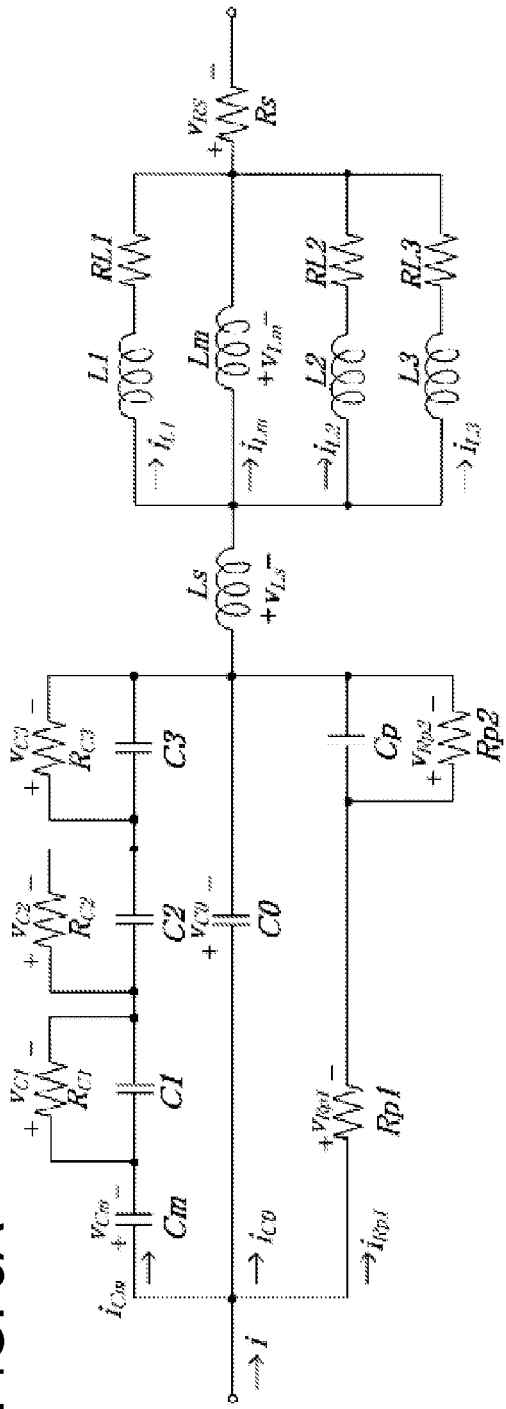
FIG. 5A shows circuit diagrams illustrating a high-accuracy wide-band equivalent circuit model that is used for an MLCC (multi-layer chip capacitor) according to Embodiment 4 of the present invention.
Figure 5B:
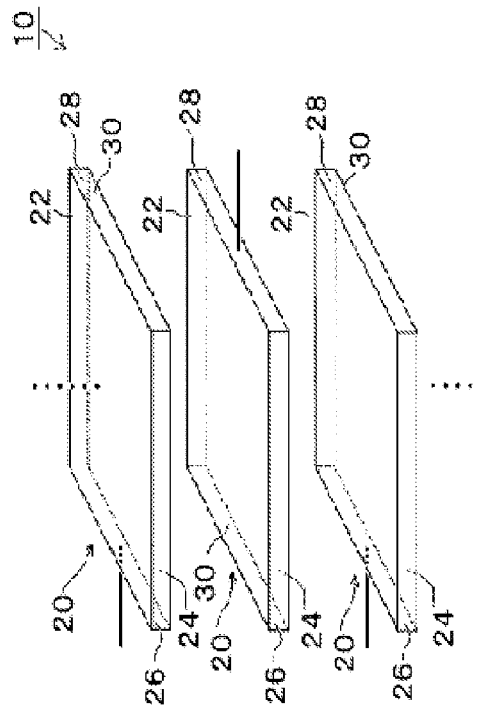
FIG. 5B is a diagram illustrating a laminated structure of electrodes thereof.

A SPICE model for an MLCC has been disclosed by the inventor of the present invention in Japanese Patent Application No. 2010 −136335 corresponding to U.S. patent application Ser. No. 13/160,394, which has been incorporated by reference above in this application. This is a high-accuracy wide-band SPICE model that uses an RLC equivalent circuit as a basic circuit and that was developed based on the internal electromagnetic characteristics of the MLCC. The circuit configuration of the SPICE model is shown in FIG. 5A. In this equivalent circuit, thicknesses of a plurality of internal electrodes of a multi-layer chip capacitor are taken into account. As shown in FIG. 5B, in a multi-layer chip capacitor 10, a plurality of internal electrodes 20 are laminated and are led out toward the opposite directions alternately. In order to obtain more accurate equivalent circuit, not only the electromagnetic effects on top surfaces 22 and bottom surfaces 24 of the plurality of internal electrodes 20, but also the electromagnetic effects on one side surfaces 26, the other side surfaces 28, and open end surfaces 30 of the plurality of internal electrodes need to be taken into account.

The equivalent circuit shown in FIG. 5A is configured in view of the above-mentioned point. C0 is a static capacitance, and Cm, C1, C2, C3, RC1, RC2, and RC3 are capacitances and resistances that represent the electromagnetic effects relating to the anomalous distribution of electromagnetic fields in dielectrics that make contact with the metal surfaces of the MLCC internal electrodes. Specifically, the first parallel circuit including the capacitance C1 and the resistance RC1 is provided for taking into account the electromagnetic effect of the respective top surfaces 22 and bottom surfaces 24 of the plurality of internal electrodes 20. The second parallel circuit including the capacitance C2 and the resistance RC2 is provided for taking into account the electromagnetic effect of respective one side surfaces 26 and the other side surfaces 28 of the plurality of internal electrodes 20. The third parallel circuit including the capacitance C3 and the resistance RC3 is provided for taking into account the electromagnetic effect of the respective open end surfaces 30 of the plurality of internal electrodes 20.

Resistances Rp1 and Rp2 represent loss in the dielectrics. Cp denotes a parasitic capacitance of the dielectrics. Inductances and resistances Lm, L1, L2, L3, RL1, RL2, and RL3 represent the skin effect and the electromagnetic proximity effect of the metal surfaces of the MLCC internal electrodes. That is, when the skin effect and the electromagnetic proximity effect in the top surfaces 22, the bottom surfaces 24, the one side surfaces 26, the other side surfaces 28, and the open end surfaces 30 of the plurality of internal electrodes 20 are respectively taken into account, the circuit including the third series circuit, the fourth series circuit, and the fifth series circuit is configured. The third series circuit has the inductance L1 and the resistance RL1 connected in series. The fourth series circuit has the inductance L2 and the resistance RL2 connected in series. The fifth series circuit has the inductance L3 and the resistance RL3 connected in series. The fourth series circuit and the fifth series circuit are connected in parallel to the third series circuit. Ls is a parasitic inductance of an external electrode of MLCC, and Rs is a DC resistance of the electrode.

As described above, the frequency-dependent inductance element L and capacitance element C in the RLC series basic equivalent circuit shown in FIG. 4A are respectively replaced with the ladder circuit constituted of Ls, Lm, L1, RL1, L2, RL2, L3, and RL3 and the ladder circuit constituted of C0, Cm, C1, RC1, C2, RC2, C3, and RC3. These ladder circuits are configured by taking into account the metal skin effect and the electromagnetic proximity effect of the MLCC internal electrodes or the electromagnetic effect related to the anomalous distribution of the electromagnetic fields inside of the dielectrics that make contact with the metal surfaces of the internal electrodes. A high-accuracy wide-band SPICE model is provided in this way.

In FIG. 5A, $v_{C0}$, $v_{Cm}$, $v_{C1}$, $v_{C2}$, $v_{C3}$, $V_{Rp1}$, $V_{Rp2}$, $V_{Ls}$, $v_{Lm}$, and $v_{Rs}$ represent voltages of the capacitance elements C0, Cm, C1, C2, and C3, the resistance elements Rp1 and Rp2, the inductance elements Ls and Lm, and the resistance element Rs, respectively. Also, $i_{C0}$, $i_{Cm}$, $i_{Rp1}$, $i_{Lm}$, $i_{L1}$, $i_{L2}$, and $i_{L3}$ represent currents through the capacitance elements C0 and Cm, the resistance element Rp1, the inductance element Lm, L1, L2, and L3, respectively. The total current through the MLCC is represented by "i." The various circuit elements in FIG. 5A are affected by a DC bias voltage. The characteristics changes in the respective circuit elements caused by the DC bias voltage can be obtained by actual measurement and can be expressed by polynomials.

Circuit equations of the following Formula 43 are given by the circuit of FIG. 5.

Formula 43

$$v_{C0} = v_{Cm} + v_{C1} + v_{C2} + v_{C3} \quad (1)$$

$$C1(V_{dc})dv_{C1}/dt + v_{C1}/Rc1(V_{dc}) = i_{Cm} \quad (2)$$

$$C2(V_{dc})dv_{C2}/dt + v_{C2}/Rc2(V_{dc}) = i_{Cm} \quad (3)$$

$$C3(V_{dc})dv_{C3}/dt + v_{C3}/Rc3(V_{dc}) = i_{Cm} \quad (4)$$

$$i_{Cm} = Cm(V_{dc})dv_{Cm}/dt \quad (5)$$

$$v_{C0} = v_{Rp1} + v_{Rp2} \quad (6)$$

$$v_{Rp2}/Rp2(V_{dc}) + Cp(V_{dc})dv_{Rp2}/dt = i_{Rp1} \quad (7)$$

$$i_{Rp1} = v_{Rp1}/Rp1 \quad (8)$$

$$i = i_{Cm} + i_{C0} + i_{Rp1} \quad (9)$$

$$i_{C0} = C0(V_{dc})dv_{C0}/dt \quad (10)$$

$$i = i_{Lm} + i_{L1} + i_{L2} + i_{L3} \quad (11)$$

$$L1(V_{dc})di_{L1}/dt + RL1(V_{dc})i_{L1} = v_{LM} \quad (12)$$

$$L2(V_{dc})di_{L2}/dt + RL2(V_{dc})i_{L2} = v_{LM} \quad (13)$$

$$L3(V_{dc})di_{L3}/dt + RL3(V_{dc})i_{L3} = v_{LM} \quad (14)$$

$$v_{Lm} = Lm(V_{dc})di_{Lm}/dt \quad (15)$$

$$v = v_{C0} + v_{Ls} + v_{Lm} + v_{Rs} \quad (16)$$

$$v_{Ls} = Ls(V_{dc})di/dt \quad (17)$$

$$v_{Rs} = Rs(V_{dc})i \quad (18)$$

The circuit equations in the above-mentioned Formula 43 are simultaneous equations and are very complicated, but they can be solved by configuring a calculation circuit. In order to configure a stable negative feedback circuit, the above-mentioned equations are rewritten and are divided into five sets of equations for convenience. First, equations (1) to (5) in Formula 43 above are rewritten as a set of equations shown in Formula 44.

$$\begin{cases} v_{Cm} = v_{C0} - v_{C1} - v_{C2} - v_{C3} \\ v_{C1} = RC1(V_{dc})[Cm(V_{dc})dv_{Cm}/dt - C1(V_{dc})dv_{C1}/dt] \\ v_{C2} = RC2(V_{dc})[Cm(V_{dc})dv_{Cm}/dt - C2(V_{dc})dv_{C2}/dt] \\ v_{C3} = RC3(V_{dc})[Cm(V_{dc})dv_{Cm}/dt - C3(V_{dc})dv_{C3}/dt] \end{cases} \quad \text{Formula 44}$$

Next, equations (6) to (8) in Formula 43 above are rewritten as a set of equations shown in Formula 45.

$$\begin{cases} v_{Rp1} = v_{C0} - v_{Rp2} \\ v_{Rp2} = Rp2(V_{dc})[v_{Rp1}/Rp1(V_{dc}) - Cp(V_{dc})dv_{Rp2}/dt] \end{cases} \quad \text{Formula 45}$$

Next, equations (5), (8) to (10) in Formula 43 above are rewritten as a set of equations shown in Formula 46.

$$\begin{cases} i = i_{C0} + i_{Cm} + i_{Rp1} \\ i_{C0} = C0(V_{dc})dv_{C0}/dt \\ i_{Cm} = Cm(V_{dc})dv_{Cm}/dt \\ i_{Rp1} = v_{Rp1}/Rp1(V_{dc}) \end{cases} \quad \text{Formula 46}$$

Next, equations (11) to (15) in Formula 43 above are rewritten as a set of equations shown in Formula 47.

$$\begin{cases} i_{Lm} = i - i_{L1} - i_{L2} - i_{L3} \\ i_{L1} = [Lm(V_{dc})dv_{Lm}/dt - L1(V_{dc})di_{L1}/dt]/RL1(V_{dc}) \\ i_{L2} = [Lm(V_{dc})dv_{Lm}/dt - L2(V_{dc})di_{L2}/dt]/RL2(V_{dc}) \\ i_{L3} = [Lm(V_{dc})dv_{Lm}/dt - L3(V_{dc})di_{L3}/dt]/RL3(V_{dc}) \end{cases} \quad \text{Formula 47}$$

Next, equations (15) to (18) in Formula 43 above are rewritten as a set of equations shown in Formula 48.

$$\begin{cases} v_{C0} = v - v_{Ls} - v_{Lm} - v_{Rs} \\ v_{Ls} = Ls(V_{dc})di/dt \\ v_{Lm} = Lm(V_{dc})di_{Lm}/dt \\ v_{Rs} = Rs(V_{dc})i \end{cases} \quad \text{Formula 48}$$

Formulae 46 to 48 of the above-mentioned sets of equations include currents in addition to voltages. However, in the embodiments of the present invention, the inputs and outputs of all of the devices used in the calculation circuit configured to solve the circuit equation are expressed in voltages. Therefore, in the sets of equations of Formulae 46 to 48, the unit resistance Runit=1(Ω) is applied to both sides of the equations that include currents, and "v_" is placed in front of the current symbols so as to change them to voltage symbols. In this way, the currents are expressed in corresponding voltages. As a result, Formulae 46 to 48 are changed to Formulae 49 to 51 below. These sets of equations in Formulae 49 to 51 completely coincide with the above-mentioned equations in Formulae 46 to 48.

$$\begin{cases} v\_i = v\_i_{C0} + v\_i_{Cm} + v\_i_{Rp1} \\ v\_i_{C0} = Runit \times C0(V_{dc})dv_{C0}/dt \\ v\_i_{Cm} = Runit \times Cm(V_{dc})dv_{Cm}/dt \\ v\_i_{Rp1} = Runit \times v_{Rp1}/Rp1(V_{dc}) \end{cases} \quad \text{Formula 49}$$

$$\begin{cases} v\_i_{Lm} = v\_i - v\_i_{L1} - v\_i_{L2} - v\_i_{L3} \\ v\_i_{L1} = [Lm(V_{dc})dv\_i_{Lm}/dt - L1(V_{dc})dv\_i_{L1}/dt]/RL1(V_{dc}) \\ v\_i_{L2} = [Lm(V_{dc})dv\_i_{Lm}/dt - L2(V_{dc})dv\_i_{L2}/dt]/RL2(V_{dc}) \\ v\_i_{L3} = [Lm(V_{dc})dv\_i_{Lm}/dt - L3(V_{dc})dv\_i_{L3}/dt]/RL3(V_{dc}) \end{cases} \quad \text{Formula 50}$$

$$\begin{cases} v_{C0} = v - v_{Ls} - v_{Lm} - v_{Rs} \\ v_{Ls} = 1/Runit \times Ls(V_{dc})dv\_i/dt \\ v_{Lm} = 1/Runit \times Lm(V_{dc})dv\_i_{Lm}/dt \\ v_{Rs} = 1/Runit \times Rs(V_{dc})v\_i \end{cases} \quad \text{Formula 51}$$

A calculation circuit is configured to solve the five sets of simultaneous equations in Formulae 44, 45, 49, 50, and 51 above. For ease of explanation, the calculation circuit will be divided into six parts corresponding to the above-mentioned five sets of equations. Also, for ease of explanation, all of the voltage conversion coefficients of respective devices, such as a differentiator, a multiplier, and a divider, are set to the unit coefficient "1". All of the voltage conversion coefficients that are used to convert circuit elements into nonlinear voltage dependent voltage sources are set to the unit coefficient "1" as well.

(1) First, the calculation circuit of FIG. 6 configured for the set of equations in Formula 44 will be explained. The voltage $v_{Cm}$ of the capacitance element Cm is differentiated by a differentiator UD1, and an output voltage thereof and an output voltage ECm of a nonlinear voltage dependent voltage source (not shown), which replaces the capacitance element Cm, are supplied to the input side of a multiplier UD2, which then performs multiplication. An output voltage $v\_i_{Cm}$ of the multiplier UD2 is therefore expressed by the following Formula 52.

$$v\_i_{Cm} = Runit \times Cm(V_{dc})dv_{Cm}/dt \qquad \text{Formula 52}$$

Next, the voltage $v_{C1}$ of the capacitance element C1 is differentiated by a differentiator UD3, and an output voltage thereof and an output voltage EC1 of a nonlinear voltage dependent voltage source (not shown), which replaces the capacitance element C1, are supplied to the input side of a multiplier UD4, which then performs multiplication. A multiplier output voltage $v\_i_{C1}$ of the multiplier UD4 is therefore expressed by the following Formula 53.

$$v\_i_{C1} = Runit \times C1(V_{dc})dv_{C1}/dt \qquad \text{Formula 53}$$

This v_ic1 is provided to a linear voltage dependent voltage source E3 having the voltage gain of "−1" to have the sign thereof reversed, and supplied to the input side of an adder UD6. The output voltage $v\_i_{Cm}$ of the multiplier UD2 is also supplied to the adder UD6, which then performs addition. An output voltage v_i1 of the adder UD6 is therefore expressed by the following Formula 54.

$$v\_i_1 = v\_i_{Cm} - v\_i_{C1} = Runit\{Cm(V_{dc})dv_{Cm}/dt - C1(V_{dc})dv_{C1}/dt\} \qquad \text{Formula 54}$$

This v_i1 and an output voltage ERC1 of a nonlinear voltage dependent voltage source (not shown), which replaces the resistance element RC1, are supplied to the input side of a multiplier UD5, which then performs multiplication. An output voltage $v_{C1}$ of the multiplier UD5 is therefore expressed by Formula 55 below. The output voltage $v_{C1}$ of the multiplier UD5 is the input voltage of the differentiator UD3. That is, the output side of the multiplier UD5 is connected to the input side of the differentiator UD3, thereby constituting one loop circuit.

$$v_{C1} = Rc1(V_{dc})\{Cm(V_{dc})dv_{Cm}/dt - C1(V_{dc})dv_{C1}/dt\} \qquad \text{Formula 55}$$

The voltage $v_{C2}$ of the capacitance element C2 is differentiated by a differentiator UD7. An output voltage thereof and an output voltage EC2 of a nonlinear voltage dependent voltage source (not shown), which replaces the capacitance element C2, are supplied to the input side of a multiplier UD8, which then performs multiplication. An output voltage $v\_i_{C2}$ of the multiplier UD8 is therefore expressed by the following Formula 56.

$$v\_i_{C2} = Runit \times C2(V_{dc})dv_{C2}/dt \qquad \text{Formula 56}$$

This $v\_i_{C2}$ is provided to a linear voltage dependent voltage source E4 having the voltage gain of "−1" to have the sign thereof reversed, and supplied to the input side of an adder UD10. The output voltage $v\_i_{Cm}$ of the multiplier UD2 is also supplied to the adder UD10, which then performs addition. An output voltage v_i2 of the adder UD10 is therefore expressed by the following Formula 57.

$$v\_i_2 = v\_i_{Cm} - v\_i_{C2} = Runit\{Cm(V_{dc})dv_{Cm}/dt - C2(V_{dc})dv_{C2}/dt\} \qquad \text{Formula 57}$$

This v_i2 and an output voltage ERC2 of a nonlinear voltage dependent voltage source (not shown), which replaces the resistance element RC2, are supplied to the input side of a multiplier UD9, which then performs multiplication. An output voltage $v_{C2}$ of the multiplier UD9 is therefore expressed by Formula 58. The output voltage $v_{C2}$ of the multiplier UD9 is the input voltage of the differentiator UD7. That is, the output side of the multiplier UD9 is connected to the input side of the differentiator UD7, thereby constituting one loop circuit.

$$v_{C2} = Rc2(V_{dc})\{Cm(V_{dc})dv_{Cm}/dt - C2(V_{dc})dv_{C2}/dt\} \qquad \text{Formula 58}$$

The voltage $v_{C3}$ of the capacitance element C3 is differentiated by a differentiator UD11. An output voltage thereof and an output voltage EC3 of a nonlinear voltage dependent voltage source (not shown), which replaces the capacitance element C3, are supplied to the input side of a multiplier UD12, which then performs multiplication. An output voltage $v\_i_{C3}$ of the multiplier UD12 is therefore expressed by the following Formula 59.

$$v\_i_{C3} = Runit \times C3(V_{dc})dv_{C3}/dt \qquad \text{Formula 59}$$

This $v\_i_{C3}$ is provided to a linear voltage dependent voltage source E5 having the voltage gain of "−1" to have the sign thereof reversed, and supplied to the input side of an adder UD14. The output voltage $v\_i_{Cm}$ of the multiplier UD2 is also supplied to the adder UD14, which then performs addition. An output voltage v_i3 of the adder UD14 is therefore expressed by the following Formula 60.

$$v\_i_3 = v\_i_{Cm} - v\_i_{C3} = Runit\{Cm(V_{dc})dv_{Cm}/dt - C3(V_{dc})dv_{C3}/dt\} \qquad \text{Formula 60}$$

This v_i3 and an output voltage ERC3 of a nonlinear voltage dependent voltage source (not shown), which replaces the resistance element RC3, are supplied to the input side of a multiplier UD13, which then performs multiplication. An output voltage $v_{C3}$ of the multiplier UD13 is therefore expressed by Formula 61 below. The output voltage $v_{C3}$ of the multiplier UD13 is the input voltage of the differentiator UD11. That is, the output side of the multiplier UD13 is connected to the input side of the differentiator UD11, thereby constituting one loop circuit.

$$v_{C3} = Rc3(V_{dc})\{Cm(V_{dc})C3(V_{dc})dv_{C3}/dt\} \qquad \text{Formula 61}$$

The voltages $v_{C1}$, $v_{C2}$, and $v_{C3}$ of the capacitance elements C1, C2, and C3 derived in a manner described above are respectively provided to linear voltage dependent voltage sources E6, E7, and E8 having the voltage gains of "−1" to have the signs thereof reversed, and supplied to the adder input side of an adder UD15. The voltage $v_{C0}$ of the capacitance element C0 is also supplied to the adder UD15, which then performs addition. By this operation, the output voltage $v_{Cm}$ of the adder UD15 becomes a voltage of the capacitance element Cm, which constitutes a feedback circuit. Taking into account response characteristics of this feedback circuit, the output voltage transfer functions of the three output voltages $v_{C1}$, $v_{C2}$, and $v_{C3}$ for the input voltage $v_{C0}$ are respectively defined by the following Formula 62.

$$G_{C1}(\omega) = \frac{v_{C1}(\omega)}{v_{C0}(\omega)} \quad G_{C2}(\omega) = \frac{v_{C2}(\omega)}{v_{C0}(\omega)} \quad G_{C3}(\omega) = \frac{v_{C3}(\omega)}{v_{C0}(\omega)} \qquad \text{Formula 62}$$

The three open loop voltage transfer functions are respectively defined by the following Formula 63.

$$A_{C1}(\omega) = \frac{v_{C1}(\omega)}{v_{Cm}(\omega)} \quad A_{C2}(\omega) = \frac{v_{C2}(\omega)}{v_{Cm}(\omega)} \quad A_{C3}(\omega) = \frac{v_{C3}(\omega)}{v_{Cm}(\omega)} \quad \text{Formula 63}$$

From the Formulae 62 and 63, the following Formula 64 is derived.

$$G_{C1}(\omega) = \frac{A_{C1}(\omega)}{1 + A_{C1}(\omega) + A_{C2}(\omega) + A_{C3}(\omega)} \quad \text{Formula 64}$$

$$G_{C2}(\omega) = \frac{A_{C2}(\omega)}{1 + A_{C1}(\omega) + A_{C2}(\omega) + A_{C3}(\omega)}$$

$$G_{C3}(\omega) = \frac{A_{C3}(\omega)}{1 + A_{C1}(\omega) + A_{C2}(\omega) + A_{C3}(\omega)}$$

$$A_{C1}(\omega) = \frac{j\omega RC1(V_{dc})Cm(V_{dc})}{1 + j\omega RC1(V_{dc})C1(V_{dc})}$$

$$A_{C2}(\omega) = \frac{j\omega RC2(V_{dc})Cm(V_{dc})}{1 + j\omega RC2(V_{dc})C2(V_{dc})}$$

$$A_{C3}(\omega) = \frac{j\omega RC3(V_{dc})Cm(V_{dc})}{1 + j\omega RC3(V_{dc})C3(V_{dc})}$$

According to Formula 64 above, the overall feedback circuit that is configured by feeding the three voltages $v_{C1}$, $v_{C2}$, and $v_{C3}$ back to the adder input side of the adder UD15 becomes negative. Further, a relationship represented by Formula 65 below is satisfied for whole frequency range. Thus, it can be determined that this feedback circuit is a stable negative feedback circuit.

$$\begin{aligned}
&1 + A_{C1}(\omega) + A_{C2}(\omega) + A_{C3}(\omega) = \\
&1 + \frac{j\omega RC1(V_{dc})Cm(V_{dc})}{1 + j\omega RC1(V_{dc})C1(V_{dc})} + \frac{j\omega RC2(V_{dc})Cm(V_{dc})}{1 + j\omega RC2(V_{dc})C2(V_{dc})} + \\
&\frac{j\omega RC3(V_{dc})Cm(V_{dc})}{1 + j\omega RC3(V_{dc})C3(V_{dc})} = \Big\{ 1 + \frac{\omega^2 RC1^2(V_{dc})Cm(V_{dc})C1(V_{dc})}{1 + \omega^2 RC1^2(V_{dc})C1^2(V_{dc})} + \\
&\frac{\omega^2 RC2^2(V_{dc})Cm(V_{dc})C2(V_{dc})}{1 + \omega^2 RC2^2(V_{dc})C2^2(V_{dc})} + \\
&\frac{\omega^2 RC3^2(V_{dc})Cm(V_{dc})C3(V_{dc})}{1 + \omega^2 RC3^2(V_{dc})C3^2(V_{dc})} \Big\} + \\
&j\omega \Big\{ \frac{RC1(V_{dc})Cm(V_{dc})}{1 + \omega^2 RC1^2(V_{dc})C1^2(V_{dc})} + \frac{RC2(V_{dc})Cm(V_{dc})}{1 + \omega^2 RC2^2(V_{dc})C2^2(V_{dc})} + \\
&\frac{RC3(V_{dc})Cm(V_{dc})}{1 + \omega^2 RC3^2(V_{dc})C3^2(V_{dc})} \Big\} \neq 0
\end{aligned} \quad \text{Formula 65}$$

(2) Next, the calculation circuit in FIG. 7 configured for the set of equations in Formula 45 will be explained. The voltage $V_{Rp2}$ of the resistance element Rp2 is differentiated by a differentiator UD16, and an output voltage thereof and an output voltage ECp of a nonlinear voltage dependent voltage source (not shown), which replaces the capacitance element Cp, are supplied to the input side of a multiplier UD17, which then performs multiplication. An output voltage $v\_i_{Cp}$ of the multiplier UD17 is therefore expressed by the following Formula 66.

$$v\_i_{Cp} = \text{Runit} \times Cp(V_{dc}) dv_{Cp}/dt \quad \text{Formula 66}$$

The voltage $v_{Rp1}$ of the resistance element Rp1 and an output voltage ERp1 of a nonlinear voltage dependent voltage source (not shown), which replaces the resistance element Rp1, are supplied to the divisor input terminal and the dividend input terminal of a divider UD18, respectively, which then performs division. An output voltage $v\_i_{Rp1}$ of the divider UD18 is therefore expressed by the following Formula 67.

$$v\_i_{Rp1} = \text{Runit} \times v_{Rp1}/Rp1(V_{dc}) \quad \text{Formula 67}$$

The above-mentioned output voltage $v\_i_{Cp}$ of the multiplier UD17 is provided to a linear voltage dependent voltage source E9 having the voltage gain of "−1" to have the sign thereof reversed, and supplied to the adder input side of an adder UD19. The output voltage $v\_i_{Rp1}$ of the divider UD18 is also supplied to the adder UD19, which then performs addition. An output voltage $v\_i_{Rp2}$ of the adder UD19 is therefore expressed by the following Formula 68.

$$v\_i_{Rp2} = v\_i_{Rp1} - v\_i_{Cp} = \text{Runit}\{v_{Rp1}/Rp1(V_{dc}) - Cp(V_{dc}) dv_{Rp2}/dt\} \quad \text{Formula 68}$$

This $v\_i_{Rp2}$ and an output voltage ERp2 of a nonlinear voltage dependent voltage source (not shown), which replaces the resistance element Rp2, are supplied to the input side of a multiplier UD20, which then performs multiplication. An output voltage $V_{Rp2}$ of the multiplier UD20 is therefore expressed by Formula 69 below. The output voltage $V_{Rp2}$ of the multiplier UD20 is the input voltage of the differentiator UD16. That is, the output side of the multiplier UD20 is connected to the differentiator input side of the differentiator UD16, thereby constituting one loop circuit.

$$v_{Rp2} = Rp2(V_{dc})\{v_{Rp1}/Rp1(V_{dc}) - Cp(V_{dc}) dv_{Rp2}/dt\} \quad \text{Formula 69}$$

This $V_{Rp2}$ is provided to a linear voltage dependent voltage source E10 having the voltage gain of "−1" to have the sign thereof reversed, and supplied to the input side of an adder UD21. The voltage $v_{C0}$ of the capacitance element C0 is also supplied to the adder UD21, which then performs addition. Because the output voltage of the adder UD21 is $v_{Rp1}$, one feedback circuit is constituted here. In a manner similar to above, taking into account response characteristics of this feedback circuit in frequency domain, the I/O voltage transfer function GRp2($\omega$) and the open loop voltage transfer function ARp2($\omega$) are respectively defined by Formula 70 below. From this Formula 70, it is found that the feedback circuit configured by feeding back the output voltage $V_{Rp2}$ is a negative feedback circuit.

$$G_{Rp2}(\omega) = \frac{v_{Rp2}(\omega)}{v_{C0}(\omega)} \quad A_{Rp2}(\omega) = \frac{v_{Rp2}(\omega)}{v_{Rp1}(\omega)} \quad G_{Rp2}(\omega) = \frac{A_{Rp2}(\omega)}{1 + A_{Rp2}(\omega)} \quad \text{Formula 70}$$

$$A_{Rp2}(\omega) = \frac{Rp2(V_{dc})}{Rp1(V_{dc})\{1 + j\omega Cp(V_{dc}) Rp2(V_{dc})\}}$$

Also, the following Formula 71 is satisfied for the whole frequency range. Thus, it can be determined that this feedback circuit is a stable negative feedback circuit.

$$\begin{aligned}
1 + A_{Rp2}\omega &= 1 + \frac{Rp2(V_{dc})}{Rp1(V_{dc})\{1 + j\omega Cp(V_{dc}) Rp2(V_{dc})\}} \\
&= 1 + \frac{Rp2(V_{dc})}{Rp1(V_{dc})\{1 + \omega^2 Cp^2(V_{dc}) Rp2^2(V_{dc})\}} - \\
&\quad j\omega \frac{Cp(V_{dc}) Rp2^2(V_{dc})}{Rp1(V_{dc})\{1 + \omega^2 Cp^2(V_{dc}) Rp2^2(V_{dc})\}} \\
&\neq 0
\end{aligned} \quad \text{Formula 71}$$

(3) Next, the calculation circuit in FIG. 8 configured for the set of equations in Formula 49 will be explained. The voltage $v_{C0}$ of the capacitance element C0 is differentiated by a differentiator UD22. An output voltage thereof and an output voltage EC0 of a nonlinear voltage dependent voltage source (not shown), which replaces the capacitance element C0, are supplied to the input side of a multiplier UD23, which then performs multiplication. An output voltage $v\_i_{C0}$ of the multiplier UD23 is therefore expressed by the following Formula 72.

$$v\_i_{C0} = \text{Runit} \times C0(V_{dc}) dv_{C0}/dt \qquad \text{Formula 72}$$

Figure 6:
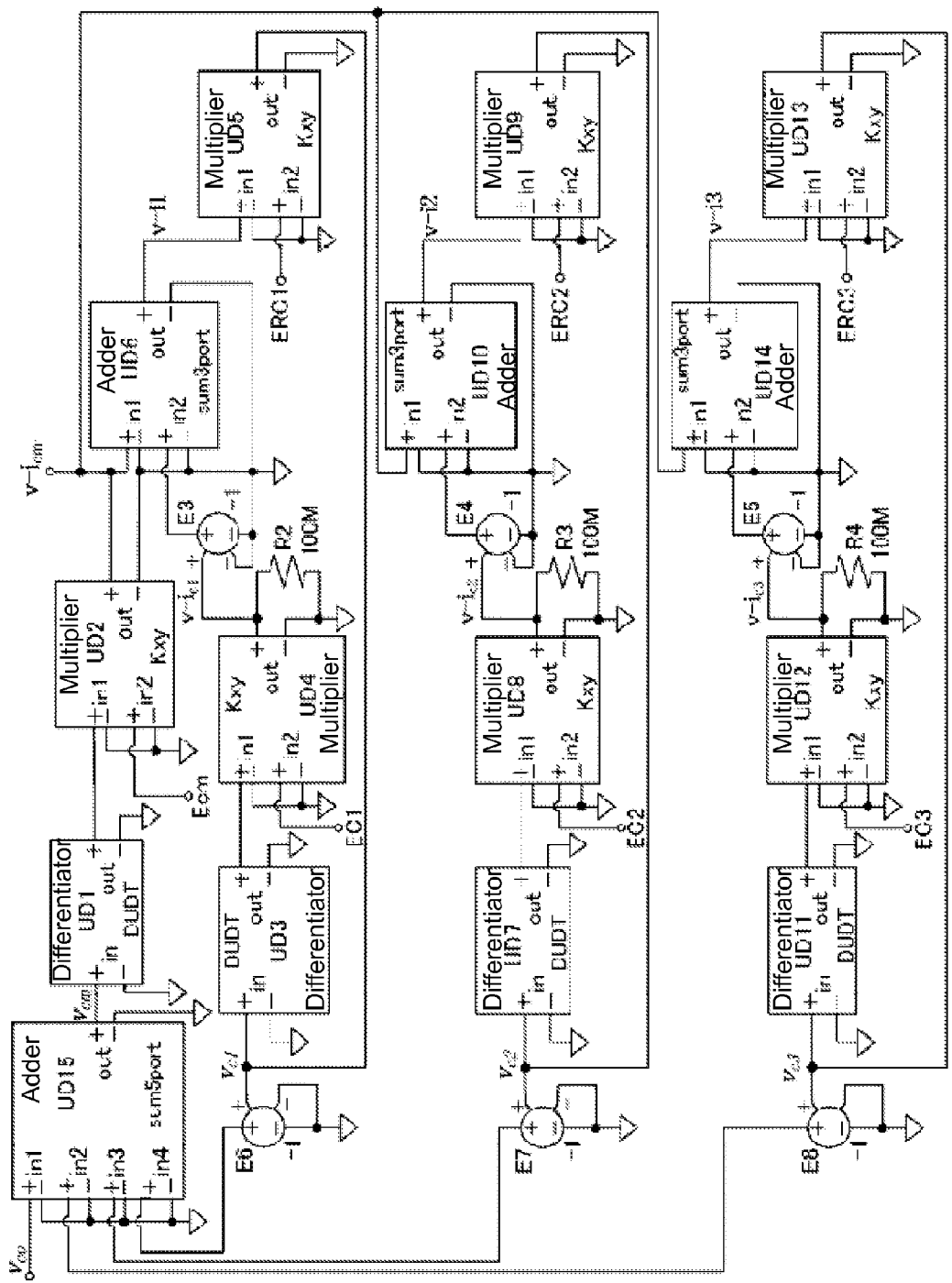
FIG. 6 is a circuit diagram showing a part of the SPICE model of Embodiment 4.
Figure 7:
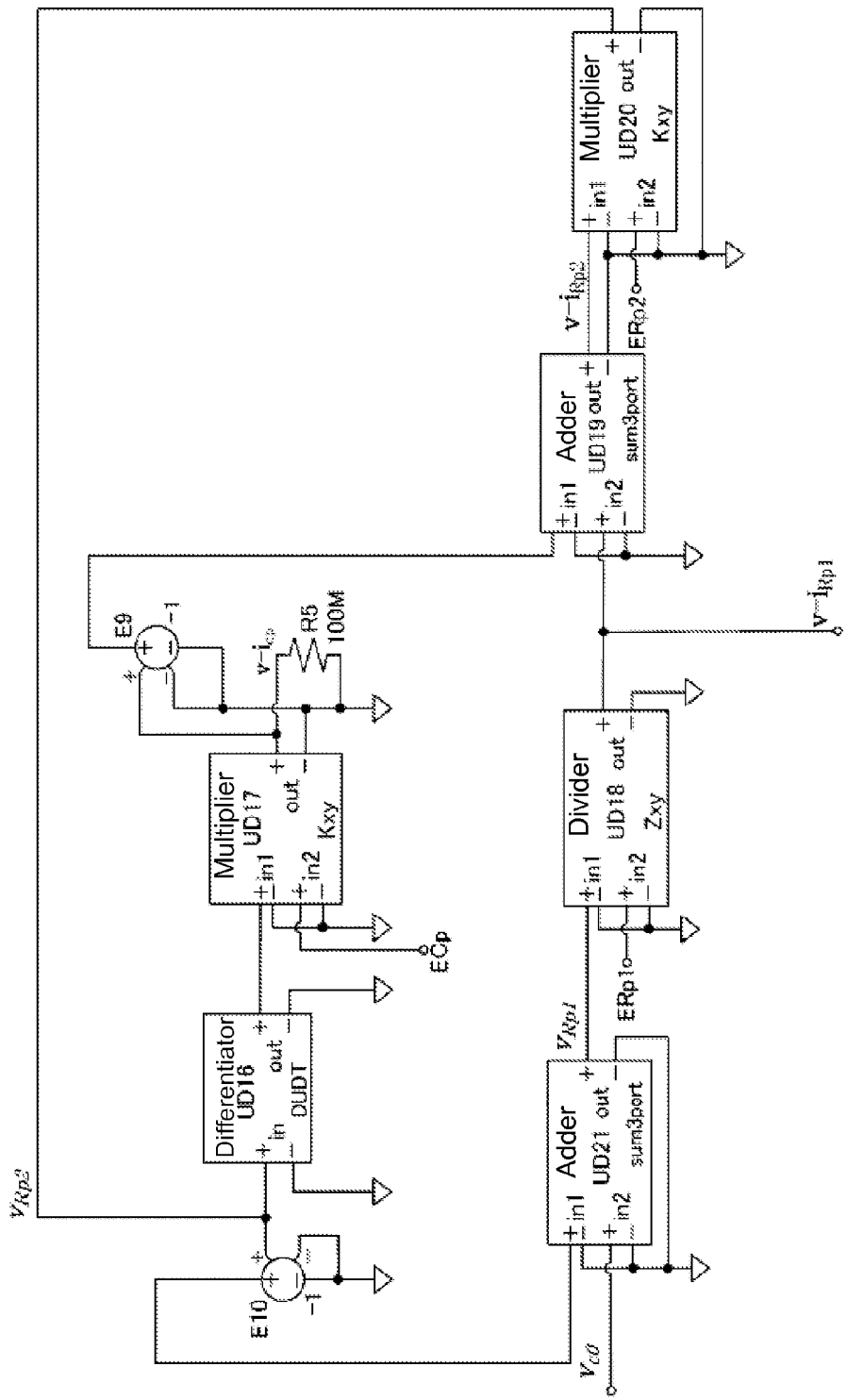
FIG. 7 is a circuit diagram showing a part of the SPICE model of Embodiment 4.

This $v\_i_{C0}$, the output voltage $v\_i_{Cm}$, of the multiplier UD2 in FIG. 6, and the output voltage $v\_i_{Rp1}$ of the divider UD18 in FIG. 7 are supplied to the adder input side of the adder UD24, which then performs addition. An output voltage $v\_i$ of the adder UD24 is therefore expressed by Formula 73 below. This output voltage $v\_i$ equals a product of the current through MLCC and the unit resistance Runit.

$$v\_i = v\_i_{C0} + v\_i_{Cm} + v\_i_{Rp1} \qquad \text{Formula 73}$$

(4) Next, the calculation circuit in FIG. 9 configured for the set of equations in Formula 50 will be explained. The voltage $v\_i_{Lm}$, of the inductance element Lm is differentiated by a differentiator UD25. An output voltage thereof and an output voltage ELm of a nonlinear voltage dependent voltage source (not shown), which replaces the inductance element Lm, are supplied to the input side of a multiplier UD26, which then performs multiplication. An output voltage $v_{Lm}$, of the multiplier UD26 is therefore expressed by the following Formula 74.

$$v_{Lm} = 1/\text{Runit} \times Lm(V_{dc}) dv\_i_{Lm}/dt \qquad \text{Formula 74}$$

Next, the voltage $v\_i_{L1}$ of the inductance element L1 is differentiated by a differentiator UD27. An output voltage thereof and an output voltage EL1 of a nonlinear voltage dependent voltage source (not shown), which replaces the inductance element L1, are supplied to the input side of a multiplier UD28, which then performs multiplication. An output voltage $v_{L1}$ of the multiplier UD28 is therefore expressed by the following Formula 75.

$$v_{L1} = 1/\text{Runit} \times L1(V_{dc}) dv\_i_{L1}/dt \qquad \text{Formula 75}$$

This $v_{L1}$ is provided to a linear voltage dependent voltage source E11 having the voltage gain of "−1" to have the polarity thereof reversed, and supplied to the input side of an adder UD30. The output voltage $v_{Lm}$ of the above-mentioned multiplier UD26 is also supplied to the adder UD 30, which then performs addition. An output voltage $v_1$ of the adder UD30 is therefore expressed by the following Formula 76.

$$v_1 = v_{Lm} - v_{L1} = 1/\text{Runit}\{Lm\}V_{dc}) dv\_i_{Lm}/dt - L1(V_{dc}) dv\_i_{L1}/dt\} \qquad \text{Formula 76}$$

The voltage $v_1$ and an output voltage ERL1 of a nonlinear voltage dependent voltage source (not shown), which replaces the resistance element RL1, are supplied to the divisor input terminal and the dividend input terminal of a divider UD29, respectively, which then performs division. An output voltage $v\_i_{L1}$ of the divider UD29 is therefore expressed by Formula 77 below. The output voltage $v\_i_{L1}$ of the divider UD29 is the input voltage of the differentiator UD27. That is, the output side of the divider UD29 is connected to the input side of the differentiator UD27, thereby constituting one loop circuit.

$$v\_i_{L1} = \{Lm(V_{dc}) dv\_i_{Lm}/dt - L1(V_{dc}) dv\_i_{L1}/dt\}/RL1(V_{dc}) \qquad \text{Formula 77}$$

The voltage $v\_i_{L2}$ of the inductance element L2 is differentiated by a differentiator UD31. An output voltage thereof and an output voltage EL2 of a nonlinear voltage dependent voltage source (not shown), which replaces the inductance element L2, are supplied to the input side of a multiplier UD32, which then performs multiplication. An output voltage $v_{L2}$ of the multiplier UD32 is therefore expressed by the following Formula 78.

$$v_{L2} = 1/\text{Runit} \times L2/dv\_i_{L2}/dt \qquad \text{Formula 78}$$

This $v_{L2}$ is provided to a linear voltage dependent voltage source E12 having the voltage gain of "−1" to have the sign thereof reversed, and supplied to the input side of an adder UD34. The output voltage $v_{Lm}$, of the above-mentioned multiplier UD26 is also supplied to the adder UD34, which then performs addition. An output voltage $v_2$ of the adder UD34 is therefore expressed by the following Formula 79.

$$v_2 = v_{Lm} - v_{L2} = 1/\text{Runit}\{Lm(V_{dc}) dv\_i_{Lm}/dt - L2(V_{dc}) dv\_i_{L2}/dt\} \qquad \text{Formula 79}$$

The voltage $v_2$ and an output voltage ERL2 of a nonlinear voltage dependent voltage source (not shown), which replaces the resistance element RL2, are supplied to the divisor input terminal and the dividend input terminal of a divider UD33, respectively, which then performs division. An output voltage $v\_i_{L2}$ of the divider UD33 is therefore expressed by Formula 80 below. The output voltage $v\_i_{L2}$ of the divider UD33 is the input voltage of the differentiator UD31. That is, the divider output side of the divider UD33 is connected to the differentiator input side of the differentiator UD31, thereby constituting one loop circuit.

$$v\_i_{L2} = \{Lm(V_{dc}) dv\_i_{Lm}/dt - L2(V_{dc}) dv\_i_{L2}/dt\}/RL2(V_{dc}) \qquad \text{Formula 80}$$

The voltage $v\_i_{L3}$ of the inductance element L3 is differentiated by a differentiator UD35. An output voltage thereof and an output voltage EL3 of a nonlinear voltage dependent voltage source (not shown), which replaces the inductance element L3, are supplied to the input side of a multiplier UD36. The resulting output voltage $v_{L3}$ of the multiplier UD36 is expressed by the following Formula 81.

$$v_{L3} = 1/\text{Runit} \times L3(V_{dc}) dv\_i_{L3}/dt \qquad \text{Formula 81}$$

This $v_{L3}$ is provided to a linear voltage dependent voltage source E13 having the voltage gain of "−1" to have the sign thereof reversed, and supplied to the input side of an adder UD38. The output voltage $v_{Lm}$, of the above-mentioned multiplier UD26 is also supplied to the adder UD38, which then performs addition. An output voltage $v_3$ of the adder UD38 is therefore expressed by the following Formula 82.

$$v_3 = v_{Lm} - v_{L3} = 1/\text{Runit}\{Lm(V_{dc}) dv\_i_{Lm}/dt - L3(V_{dc}) dv\_i_{L3}/dt\} \qquad \text{Formula 82}$$

The voltage $v_3$ and an output voltage ERL3 of a nonlinear voltage dependent voltage source (not shown), which replaces the resistance element RL3, are supplied to the divisor input terminal and the dividend input terminal of a divider UD37, respectively, which then performs division. An output voltage $v\_i_{L3}$ of the divider UD37 is therefore expressed by Formula 83 below. The output voltage $v\_i_{L3}$ of the divider UD37 is the input voltage of the differentiator UD35. That is, the output side of the divider UD37 is connected to the input side of the differentiator UD35, thereby constituting one loop circuit.

$$v\_i_{L3} = \{Lm(V_{dc}) dv\_i_{Cm}/dt - L3(V_{dc}) dv\_i_{L3}/dt\}/RL3(V_{dc}) \qquad \text{Formula 83}$$

The respective voltages v_$i_{L1}$, v_$i_{L2}$, and v_$i_{L3}$ are provided to linear voltage dependent voltage sources E14, E15, and E16 having the voltage gains of "−1" to have the respective signs thereof reversed, and supplied to an adder UD39. The output voltage v_i of the adder UD24 in FIG. 8 is also supplied to the adder UD39, which then performs addition. The resulting output voltage of the adder UD39 is the voltage v_$i_{Lm}$ of the inductance element Lm, and therefore, one feedback circuit is constituted here. There are three output voltages v_$i_{L1}$, v_$i_{L2}$, and v_$i_{L3}$ for the input voltage v_i of the feedback circuit. Taking into account response characteristics of this calculation circuit in frequency domain, the three I/O voltage transfer functions are respectively defined by the following Formula 84.

$$G_{L1}(\omega) = \frac{\text{v\_}i_{L1}(\omega)}{\text{v\_}i(\omega)} = \frac{i_{L1}(\omega)}{i(\omega)}$$

$$G_{L2}(\omega) = \frac{\text{v\_}i_{L2}(\omega)}{\text{v\_}i(\omega)} = \frac{i_{L2}(\omega)}{i(\omega)}$$

$$G_{L3}(\omega) = \frac{\text{v\_}i_{L3}(\omega)}{\text{v\_}i(\omega)} = \frac{i_{L3}(\omega)}{i(\omega)}$$

Formula 84

The three open loop voltage transfer functions are defined by the following Formula 85, respectively.

$$A_{L1}(\omega) = \frac{\text{v\_}i_{L1}(\omega)}{\text{v\_}i_{Lm}(\omega)} = \frac{i_{L1}(\omega)}{i_{Lm}(\omega)}$$

$$A_{L2}(\omega) = \frac{\text{v\_}i_{L2}(\omega)}{\text{v\_}i_{Lm}(\omega)} = \frac{i_{L2}(\omega)}{i_{Lm}(\omega)}$$

$$A_{L3}(\omega) = \frac{\text{v\_}i_{L3}(\omega)}{\text{v\_}i_{Lm}(\omega)} = \frac{i_{L3}(\omega)}{i_{Lm}(\omega)}$$

Formula 85

From the Formulae 84 and 85, the following Formula 86 is derived.

$$G_{L1}(\omega) = \frac{A_{L1}(\omega)}{1 + A_{L1}(\omega) + A_{L2}(\omega) + A_{L3}(\omega)}$$

$$G_{L2}(\omega) = \frac{A_{L2}(\omega)}{1 + A_{L1}(\omega) + A_{L2}(\omega) + A_{L3}(\omega)}$$

$$G_{L3}(\omega) = \frac{A_{L3}(\omega)}{1 + A_{L1}(\omega) + A_{L2}(\omega) + A_{L3}(\omega)}$$

$$A_{L1}(\omega) = \frac{j\omega Lm(V_{dc})}{RL1(V_{dc}) + j\omega L1(V_{dc})}$$

$$A_{L2}(\omega) = \frac{j\omega Lm(V_{dc})}{RL2(V_{dc}) + j\omega L2(V_{dc})}$$

$$A_{L3}(\omega) = \frac{j\omega Lm(V_{dc})}{RL3(V_{dc}) + j\omega L3(V_{dc})}$$

Formula 86

According to Formula 86 above, the overall feedback circuit that is configured by feeding the three voltages v_$i_{L1}$, v_$i_{L2}$, and v_$i_{L3}$ back to the input side of the adder UD39 is a negative feedback circuit. Further, a relationship represented by Formula 87 below is satisfied for the whole frequency range. Thus, it can be determined that this feedback circuit is a stable negative feedback circuit.

$$1 + A_{L1}(\omega) + A_{L2}(\omega) + A_{L3}(\omega) =$$
$$1 + \frac{j\omega Lm(V_{dc})}{RL1(V_{dc}) + j\omega L1(V_{dc})} + \frac{j\omega Lm(V_{dc})}{RL2(V_{dc}) + j\omega L2(V_{dc})} +$$
$$\frac{j\omega Lm(V_{dc})}{RL3(V_{dc}) + j\omega L3(V_{dc})} = \left\{ 1 + \frac{\omega^2 L1(V_{dc})Lm(V_{dc})}{RL1^2(V_{dc}) + \omega^2 L1^2(V_{dc})} + \right.$$
$$\frac{\omega^2 L2(V_{dc})Lm(V_{dc})}{RL2^2(V_{dc}) + \omega^2 L2^2(V_{dc})} + \frac{\omega^2 L3(V_{dc})Lm(V_{dc})}{RL3^2(V_{dc}) + \omega^2 L3^2(V_{dc})} \right\} +$$
$$j\omega \left\{ \frac{RL1(V_{dc})Lm(V_{dc})}{RL1^2(V_{dc}) + \omega^2 L1^2(V_{dc})} + \frac{RL2(V_{dc})Lm(V_{dc})}{RL2^2(V_{dc}) + \omega^2 L2^2(V_{dc})} + \right.$$
$$\left. \frac{RL3(V_{dc})Lm(V_{dc})}{RL3^2(V_{dc}) + \omega^2 L3^2(V_{dc})} \right\} \neq 0$$

Formula 87

Figure 10:
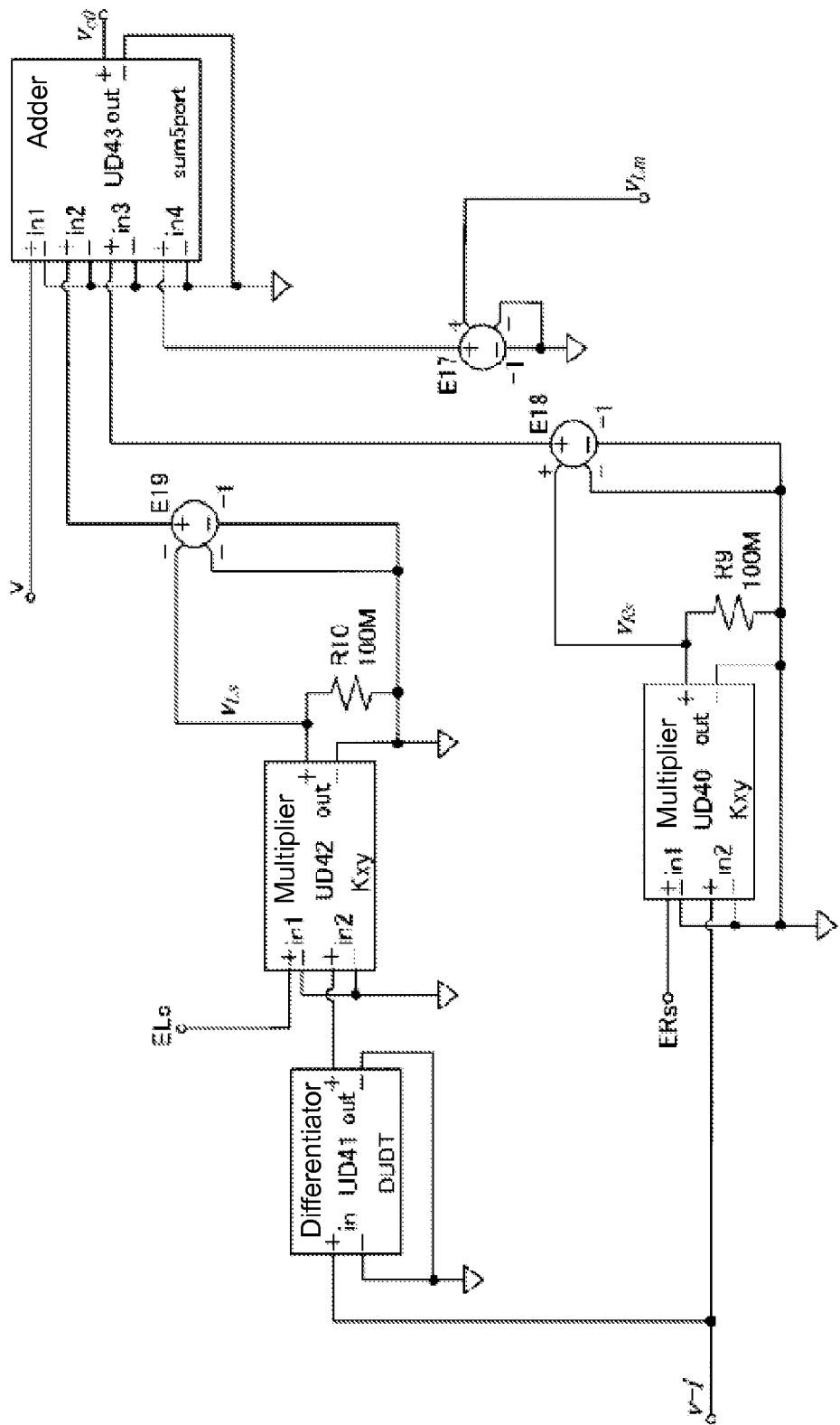
FIG. 10 is a circuit diagram showing a part of the SPICE model of Embodiment 4.

(5) Next, the calculation circuit in FIG. 10 configured for the set of equations in Formula 51 will be explained. The output voltage v_i of the adder UD24 shown in FIG. 8 is differentiated by a differentiator UD41. An output voltage of the differentiator and an output voltage ELs of a nonlinear voltage dependent voltage source (not shown), which replaces the inductance element Ls, are respectively input into the input side of a multiplier UD42, which then performs multiplication. An output voltage $v_{Ls}$ of the multiplier UD42 is therefore expressed by the following Formula 88.

$$v_{Ls} = 1/Runit \times Ls(V_{dc})dv\_i/dt$$

Formula 88

Figure 8:
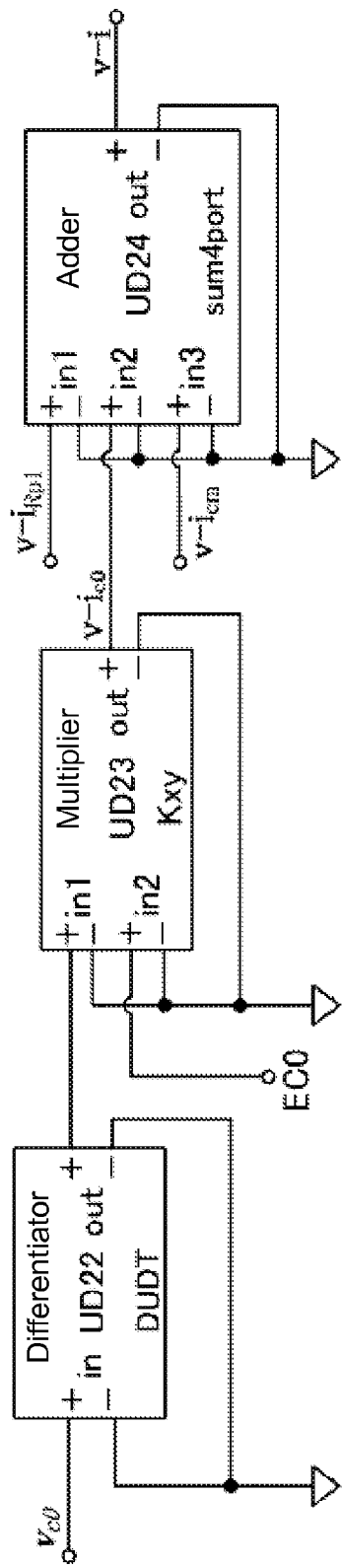
FIG. 8 is a circuit diagram showing a part of the SPICE model of Embodiment 4.

The output voltage v_i of the adder UD24 shown in FIG. 8 and an output voltage ERs of a nonlinear voltage dependent voltage source (not shown), which replaces the resistance element Rs, are input into the input side of a multiplier UD40, which then performs multiplication. An output voltage $v_{1z}$, of the multiplier UD40 is therefore expressed by the following Formula 89.

$$v_{Rs} = 1/Runit \times Rs(V_{dc})v\_i$$

Formula 89

Figure 9:
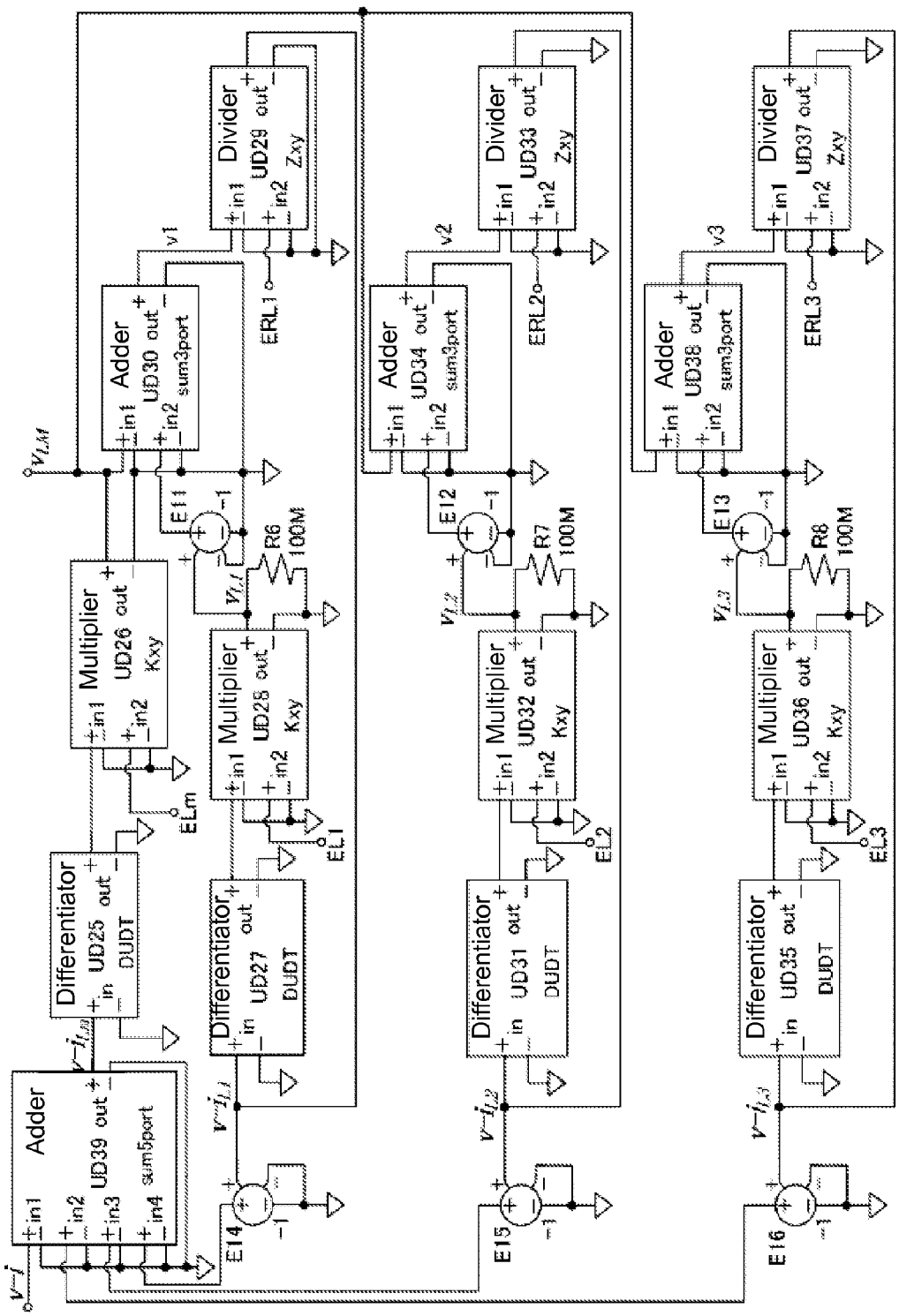
FIG. 9 is a circuit diagram showing a part of the SPICE model of Embodiment 4.

The output voltage $v_{1z}$, of the multiplier UD40, the output voltage $v_{Ls}$ of the multiplier UD42, and the above-mentioned output voltage $v_{Lm}$ of the multiplier UD26 in FIG. 9 are provided to linear voltage dependent voltage sources E18, E19, and E17 having the control efficient of "−1" to have the respective signs thereof reversed, and supplied to the input side of an adder UD43. The total voltage "v" applied to MLCC is also supplied to the adder UD43, which then performs addition. The total voltage "v" is applied to the input terminal of the adder UD43 through the linear voltage dependent voltage source E2. The output voltage $v_{c0}$ of the adder UD43 is respectively connected to one of the input terminals of the adder UD15 shown in FIG. 6, one of the input terminals of the adder UD21 shown in FIG. 7, and the input terminal of the differentiator UD22 shown in FIG. 8, thereby configuring one complete calculation circuit as a whole.

Taking into account response characteristics of this calculation circuit in frequency domain, the three I/O voltage transfer functions are defined by the following Formula 90.

$$G_{Ls}(\omega) = \frac{v_{Ls}(\omega)}{v(\omega)} \quad G_{Rs}(\omega) = \frac{v_{Rs}(\omega)}{v(\omega)} \quad G_{Lm}(\omega) = \frac{v_{Lm}(\omega)}{v(\omega)}$$

Formula 90

The three open loop voltage transfer functions are defined by the following Formula 91.

$$A_{Ls}(\omega) = \frac{v_{Ls}(\omega)}{v_{C0}(\omega)} \quad A_{Rs}(\omega) = \frac{v_{Rs}(\omega)}{v_{C0}(\omega)} \quad A_{Lm}(\omega) = \frac{v_{Lm}(\omega)}{v_{C0}(\omega)} \quad \text{Formula 91}$$

The following Formula 92 is derived from the formulae 90 and 91.

$$G_{Ls}(\omega) = \frac{A_{Ls}(\omega)}{1 + A_{Ls}(\omega) + A_{Rs}(\omega) + A_{Lm}(\omega)} \quad \text{Formula 92}$$

$$G_{Rs}(\omega) = \frac{A_{Rs}(\omega)}{1 + A_{Ls}(\omega) + A_{Rs}(\omega) + A_{Lm}(\omega)}$$

$$G_{Lm}(\omega) = \frac{A_{Lm}(\omega)}{1 + A_{Ls}(\omega) + A_{Rs}(\omega) + A_{Lm}(\omega)}$$

$$A_{Ls}(\omega) = j\omega Ls(V_{dc})\left\{j\omega C0(V_{dc}) + \frac{j\omega Cm(V_{dc})}{1 + A_{C1}(\omega) + A_{C2}(\omega) + A_{C3}(\omega)} + \frac{1}{Rp1(V_{dc})[1 + A_{Rp2}(\omega)]}\right\}$$

$$A_{Rs}(\omega) = Rs(V_{dc})\left\{j\omega C0(V_{dc}) + \frac{j\omega Cm(V_{dc})}{1 + A_{C1}(\omega) + A_{C2}(\omega) + A_{C3}(\omega)} + \frac{1}{Rp1(V_{dc})[1 + A_{Rp2}(\omega)]}\right\}$$

$$A_{Lm}(\omega) = \frac{j\omega Lm(V_{dc})}{1 + A_{L1}(\omega) + A_{L2}(\omega) + A_{L3}(\omega)} \left\{j\omega C0(V_{dc}) + \frac{j\omega Cm(V_{dc})}{1 + A_{C1}(\omega) + A_{C2}(\omega) + A_{C3}(\omega)} + \frac{1}{Rp1(V_{dc})[1 + A_{Rp2}(\omega)]}\right\}$$

From these Formulae, it is found that the feedback circuit configured by using the adder UD43 as a main device is a negative feedback circuit. Further, these Formulae prove that a relationship expressed by Formula 93 below is satisfied for the whole frequency range. Thus, it can be determined that this feedback circuit is a stable negative feedback circuit.

$$1 + A_{Ls}(\omega) + A_{Rs}(\omega) + A_{Lm}(\omega) \neq 0 \quad \text{Formula 93}$$

Figure 11:
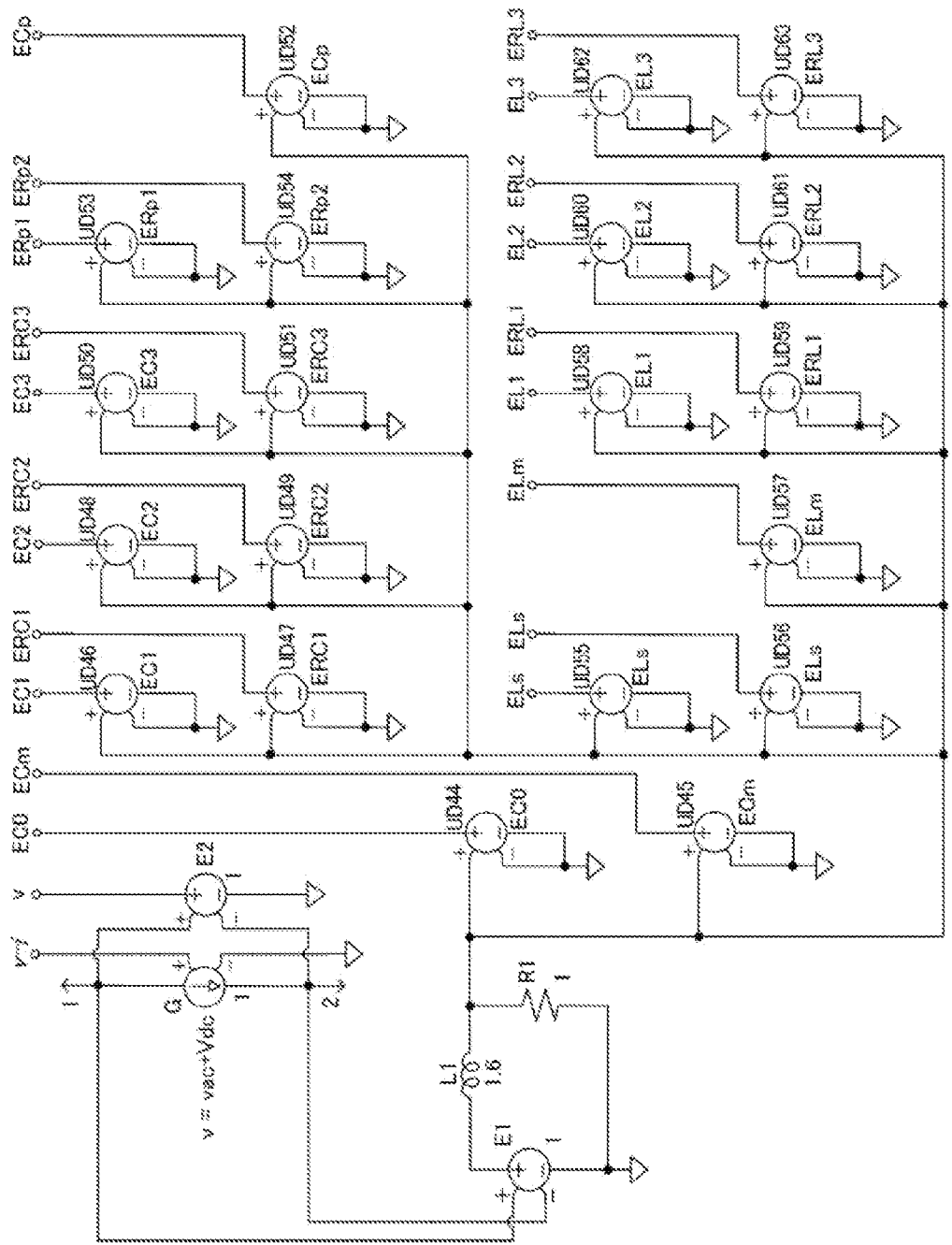
FIG. 11 is a circuit diagram showing a part of the SPICE model of Embodiment 4.

(6) Next, a calculation circuit in FIG. 11 that shows input and output units of a SPICE model will be explained. The total voltage "$v = v_{ac} + V_{dc}$" applied across the MLCC is applied to one of the input terminals of the adder UD43 of FIG. 10 through the linear voltage dependent voltage source E2 having a control efficient of "1". All of the twenty circuit elements in the high-accuracy wide-band equivalent circuit model for the MLCC shown in FIG. 5 are affected by the DC bias voltage $V_{dc}$, and are replaced with nonlinear voltage dependent voltage sources UD44 to UD63 shown in FIG. 11, respectively. Characteristics changes in the nonlinear voltage dependent voltage sources UD44 to UD63 caused by the DC bias voltage $V_{dc}$ can be obtained by actual measurement, and can be expressed by the above-mentioned polynomials in Formula 15.

The DC bias voltage can be obtained by filtering the total voltage "v" applied across the MLCC using a low-pass filter constituted of the linear voltage dependent voltage source E1 having the voltage gain of "1" and elements L1 and R1. The MLCC itself is replaced with the linear voltage dependent current source G having the transconductance of 1(S), and is controlled by the output voltage v_i of the adder UD24 in FIG. 8.

Figure 12:
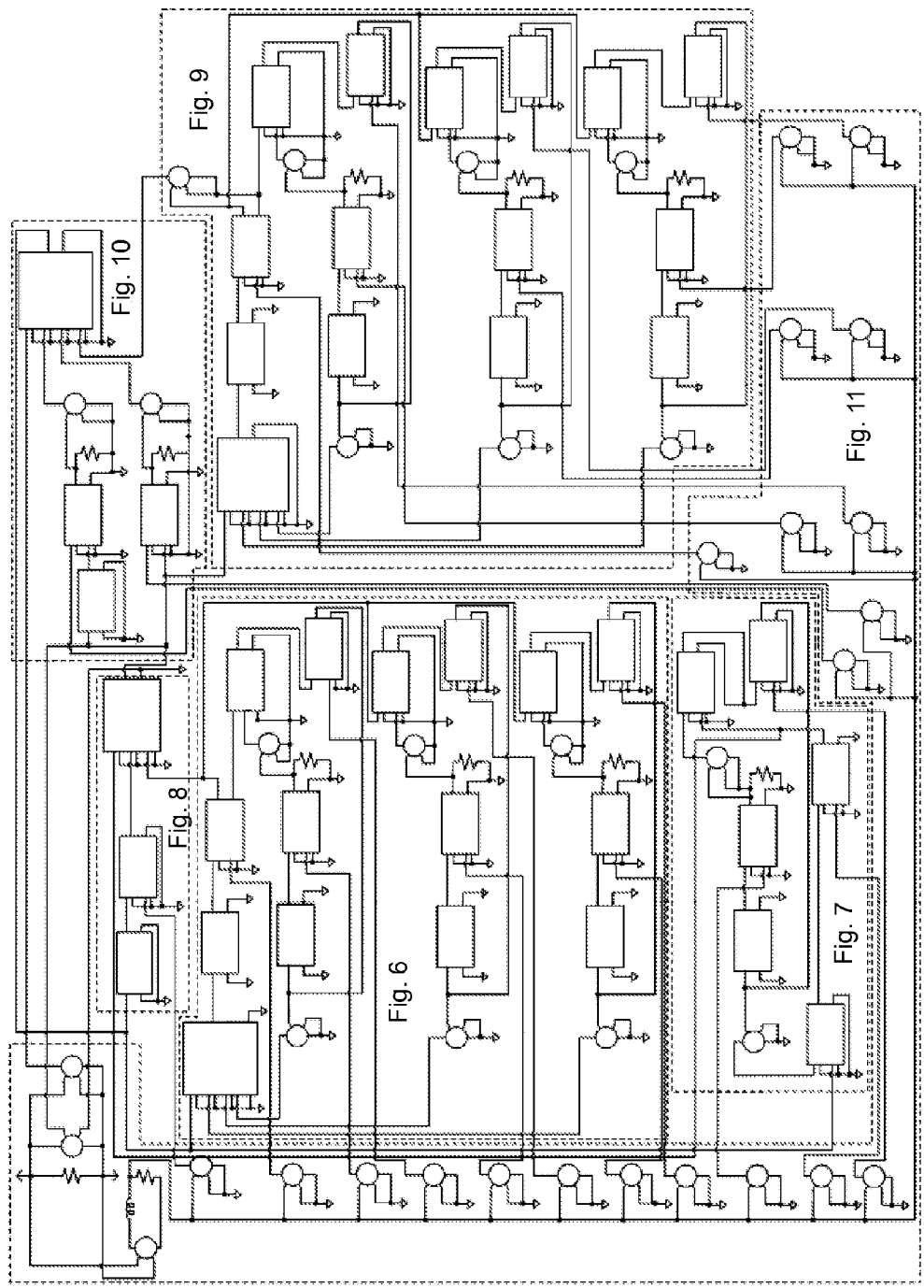
FIG. 12 is a circuit diagram showing the entire SPICE model of Embodiment 4.

FIG. 12 collectively shows FIGS. 6 to 11 above. This is the high-accuracy wide-band SPICE model for an MLCC with the DC bias applied thereto. The SPICE model shown in FIG. 12 employs dividers and five-port adders, in addition to differentiators, multipliers, three-port and four-port adders, and the like that have been defined as the standard devices of a SPICE simulator. These divider and five-port adder can be defined by utilizing prescribed operators of the SPICE simulator through construction of an Arbitrary Behavioral Voltage Source.

The following SpiceFile12 is a SPICE file of the divider. The voltage conversion coefficient of the divider is the unit conversion coefficient and therefore not shown.
*SpiceFile12: Zxy.sub
*The SpiceFile12 defines a divider (in1 divided by in2).
.SubCkt Zxy 1 2 3 4 5 6
B 5 6 V=V(1,2)/V(3,4)
.ends Zxy The following SpiceFile13 is a SPICE file of the five-port adder.
*SpiceFile13: sum5port.sub
*The SpiceFile13 defines a 5-port adder with 4 input and 1 output.
.SubCkt sum5port 1 2 3 4 5 6 7 8 9 10
B 9 10 V=V(1,2)+V(3,4)+V(5,6)+V(7,8)
.ends sum5port The following SpiceFile14 is a SPICE file of the high-accuracy wide-band SPICE model for MLCC with the DC bias applied thereto.
*SpiceFile14: MLCC_Class2_DCBias_Model4.sub
*SpiceFile14 is the spice model (Model 4) for the DC bias characteristic
*of the MLCC (Class2).
*The broad-band high-precision equivalent circuit of the MLCC is used.
.SubCkt MLCC_Class2_DCBias_Model4 1 2
L1 46 47 1.6
R1 47 0 1
E1 46 0 1 2 1
E2 17 0 1 2 1
G 2 1 8 0 1
XU1 20 0 21 0 DUDT
XU2 21 0 25 0 16 0 Kxy
XU3 37 0 38 0 DUDT
XU4 38 0 40 0 29 0 Kxy
R2 29 0 100 meg
E3 26 0 29 0 -1
XU6 16 0 26 0 23 0 sum3port
XU5 23 0 41 0 37 0 Kxy
XU7 52 0 53 0 DUDT
XU8 53 0 56 0 50 0 Kxy
R3 50 0 100 meg
E4 49 0 50 0 -1
XU10 16 0 49 0 48 0 sum3port
XU9 48 0 57 0 52 0 Kxy
XU11 66 0 67 0 DUDT
XU12 67 0 70 0 64 0 Kxy
R4 64 0 100 meg
E5 63 0 64 0 -1
XU14 16 0 63 0 62 0 sum3port
XU13 62 0 71 0 66 0 Kxy
E6 24 0 37 0 -1
E7 22 0 52 0 -1
E8 18 0 66 0 -1
XU15 27 0 18 0 22 0 24 0 20 0 sum5port
XU16 79 0 80 0 DUDT
XU17 80 0 81 0 77 0 Kxy

```
R5 77 0 100 meg
E9 76 0 77 0 -1
XU18 82 0 84 0 12 0 Zxy
XU19 76 0 12 0 83 0 sum3port
XU20 83 0 85 0 79 0 Kxy
E10 78 0 79 0 -1
XU21 78 0 27 82 0 sum3port
XU22 27 13 0 DUDT
XU23 13 0 15 0 14 0 Kxy
XU24 12 0 14 0 16 0 8 0 sum4port
XU25 30 0 31 0 DUDT
XU26 31 0 35 0 19 0 Kxy
XU27 42 0 43 0 DUDT
XU28 43 0 44 0 39 0 Kxy
R6 39 0 100 meg
E11 36 0 39 0 -1
XU30 19 0 36 0 33 0 sum3port
XU29 33 0 45 0 42 0 Zxy
XU31 58 0 59 0 DUDT
XU32 59 0 60 0 55 0 Kxy
R7 55 0 100 meg
E12 54 0 55 0 -1
XU34 19 0 54 0 51 0 sum3port
XU33 51 0 61 0 58 0 Zxy
XU35 72 0 73 0 DUDT
XU36 73 0 74 0 69 0 Kxy
R8 69 0 100 meg
E13 68 0 69 0 -1
XU38 19 0 68 0 65 0 sum3port
XU37 65 0 75 0 72 0 Zxy
E14 34 0 42 0 -1
E15 32 0 58 0 -1
E16 28 0 72 0 -1
XU39 8 0 28 0 32 0 34 0 30 0 sum5port
XU40 10 0 8 0 11 0 Kxy
XU41 8 0 9 0 DUDT
XU42 7 0 9 0 5 0 Kxy
R9 11 0 100 meg
R10 5 0 100 meg
E17 6 0 19 0 -1
E18 4 0 11 0 -1
E19 3 0 5 0 -1
XU43 17 0 3 0 4 0 6 0 27 0 sum5port
XU44 15 0 47 0 EC0
XU45 25 0 47 0 ECm
XU46 40 0 47 0 EC1
XU47 41 0 47 0 ERC1
XU48 56 0 47 0 EC2
XU49 57 0 47 0 ERC2
XU50 70 0 47 0 EC3
XU51 71 0 47 0 ERC3
XU52 81 0 47 0 ECp
XU53 84 0 47 0 ERp1
XU54 85 0 47 0 ERp2
XU55 7 0 47 0 ELs
XU56 10 0 47 0 ERs
XU57 35 0 47 0 ELm
XU58 44 0 47 0 EL1
XU59 45 0 47 0 ERL1
XU60 60 0 47 0 EL2
XU61 61 0 47 0 ERL2
XU62 74 0 47 0 EL3
XU63 75 0 47 0 ERL3
.ends MLCC_Class2_DCBias_Model4
```

As described above, according to the present embodiment, the high-accuracy wide-band equivalent circuit model for an MLCC is used as the basic equivalent circuit for the capacitor, and a number of circuit elements in the equivalent circuit are replaced with nonlinear voltage dependent voltage sources in constructing the calculation circuit for the circuit equation. This makes it possible to accurately and suitably conduct circuit design and the like of an electronic device that uses a capacitor product in a manner similar to the previous embodiments. Specifically, the present embodiment is more advantageous than Embodiments 1 to 3 in that it can be used more suitably to perform a highly accurate wide-band simulation for a circuit that employs an MLCC(s), and therefore, the detailed analysis and design of an electronic circuit including MLCC can be performed.

Next, in order to evaluate the effectiveness of the above-mentioned SPICE model for a capacitor (Class2) with a DC bias applied thereto, a comparison on frequency characteristics will be made between measurements in actual MLCC products and simulations performed using the SPICE model. Details of the used product are as follows: MLCC "EMK325BJ106KN" by TAIYO YUDEN CO., LTD; dimensions "3.2 mm×2.5 mm×1.9 mm"; nominal capacitance "10 µF"; and rated voltage "16V."

Four SPICE models for MLCC with the DC bias applied thereto were obtained for the above-mentioned four equivalent circuits of Model 1 (idealized C circuit model), Model 2 (RC circuit model), Model 3 (RLC circuit model), and Model 4 (high-accuracy wide-band equivalent circuit model), respectively. Simulations of these four SPICE models were performed using the free SPICE simulator "LTspiceIV" developed by Linear Technology Corporation, and the simulation results were compared with corresponding measurement data.

With respect to Model 1 and Model 2, because the equivalent circuits are constituted of the capacitance and the resistance under the specific frequency, the actual measurements of these circuit elements will be compared. With respect to Model 3, because there exists a significant error in the resistance of the basic equivalent circuit, the reactance of the circuit will be compared. With respect to Model 4, frequency characteristics of the impedance will be compared. Characteristics changes in the respective circuit elements in the equivalent circuits caused by the DC bias are obtained by actual measurement, and are expressed by polynomials, which define the nonlinear voltage dependent voltage sources. From the measurements, it was confirmed that the sufficient accuracy can be maintained by using polynomials of second degree to sixth degree.

For the product "EMK325BJ106KN", a SPICE file of the nonlinear voltage dependent voltage source EC used in Model 1 is as follows.

```
.SubCkt EC 1 2 3 4
EC 1 2 POLY(1) (3, 4) 8927120.88238886p
382514.259986237p  -225322.735472218p  215
42.7549230753p              -736.409163323515p
-1.18742103261127p 0.40395586448083p
.ends EC
```

A SPICE file of the nonlinear voltage dependent voltage source EC used in Model 2 is as follows.

```
.SubCkt EC 1 2 3 4
EC 1 2 POLY(1) (3, 4) 8927120.88238886p
382514.259986237p  -225322.735472218p  215
42.7549230753p              -736.409163323515p
-1.18742103261127p 0.40395586448083p
.ends EC
```

Similarly, a SPICE file of the nonlinear voltage dependent voltage source ER is as follows.
.SubCkt ER 1 2 3 4
ER 1 2 POLY(1) (3, 4) 0.360237719124427 0.101906789571558 −0.044158653097611 0.0 09126410816833319 −0.0009219529269912439 0.0000451007149870897 −0.00000085675738113744
.ends ER A SPICE file of the nonlinear voltage dependent voltage source EC used in Model 3 is as follows.
.SubCkt EC 1 2 3 4
EC 1 2 POLY(1) (3, 4) 9056047.13939988p 334088.667673313p −215121.563181128p 22086.4846833138p −1047.09596462271p 26.2783139888256p −0.34562426098894p
.ends EC Similarly, a SPICE file of the nonlinear voltage dependent voltage source ER is as follows.
.SubCkt ER 1 2 3 4
ER 1 2 POLY(1) (3, 4) 0.00357597258904067000 0.00003721224204751940
.ends ER Similarly, a SPICE file of the nonlinear voltage dependent voltage source EL is as follows.
.SubCkt EL 1 2 3 4
EL 1 2 POLY(1) (3, 4) 0.674671784805005000000n −0.00162292789360198000n
.ends EL In Model 4 that has twenty circuit elements, the corresponding twenty nonlinear voltage dependent voltage sources are used. Among them, a SPICE file of the nonlinear voltage dependent voltage source EC0 is as follows.
.SubCkt EC0 1 2 3 4
EC0 1 2 POLY(1) (3, 4) 8165299.39587045p 275883.162199974p −176661.945039749p 16194.2109529972p −542.025273710489p 2.50482920929789p 0.114220673800446p
.ends EC0

Similarly, a SPICE file of the nonlinear voltage dependent voltage source ECm is as follows.
.SubCkt ECm 1 2 3 4
ECm 1 2 POLY(1) (3, 4) 369618.80156292p 216093.170589983p −75133.2749268115p 8774.79415374994p −432.946851912885p 6.8744542277418p 0.0433422674586836p
.ends ECm Similarly, a SPICE file of the nonlinear voltage dependent voltage source EC1 is as follows.
.SubCkt EC1 1 2 3 4
EC1 1 2 POLY(1) (3, 4) 3648316.45383278p −2343848.80317318p 737372.862508774p −118250.454291895p 9944.69085988216p −417.563782579848p 6.89866614836319p
.ends EC1

Similarly, a SPICE file of the nonlinear voltage dependent voltage source ERC1 is as follows.
.SubCkt ERC1 1 2 3 4
ERC1 1 2 POLY(1) (3, 4) 74.0964280944317 10.3031059226486 25.7379140744451 −8.58404351776699 1.02247425520181 −0.048038224634638 0.000762826830751351
.ends ERC1

Similarly, a SPICE file of the nonlinear voltage dependent voltage source EC2 is as follows.
.SubCkt EC2 1 2 3 4
EC2 1 2 POLY(1) (3, 4) 710.388955392874p −1249.80880234204p 740.97311829403p −167.813962178537p 18.1001562750316p −0.86277351087665p 0.0141769547985859p
.ends EC2

Similarly, a SPICE file of the nonlinear voltage dependent voltage source ERC2 is as follows.
.SubCkt ERC2 1 2 3 4
ERC2 1 2 POLY(1) (3, 4) 31.5615288692934 −14.2213828095119 5.78512167801091 −1.0 6181137102612 0.104226158265192 −0.00500385376125223 0.00009422366602101687
.ends ERC2

Similarly, a SPICE file of the nonlinear voltage dependent voltage source EC3 is as follows.
.SubCkt EC3 1 2 3 4
EC3 1 2 POLY(1) (3, 4) 275003.769322522p 70368.5448824763p −28561.33993721p 3742.31631691008p −240.7594887726p 7.60638162156101p −0.0930670113266387p
.ends EC3

Similarly, a SPICE file of the nonlinear voltage dependent voltage source ERC3 is as follows.
.SubCkt ERC3 1 2 3 4
ERC3 1 2 POLY(1) (3, 4) 147.655709981744 −99.8823718714993 42.8717610954772 −8.66896049206844 0.878414700446228 −0.0419077517198048 0.000759505152544193
.ends ERC3

Similarly, a SPICE file of the nonlinear voltage dependent voltage source ELs is as follows.
.SubCkt ELs 1 2 3 4
ELs 1 2 POLY(1) (3, 4) 0.0477883733043889n −0.0181058047008662n 0.00655778563009 335n −0.000728122260177599n 0.00000434126794468526n 0.00000324351899957942n −0.00000012481381776643n
.ends ELs Similarly, a SPICE file of the nonlinear voltage dependent voltage source ERs is as follows.
.SubCkt ERs 1 2 3 4
ERs 1 2 POLY(1) (3, 4) 0.00355923188769403 0.0000060728959685008 −0.00000561783364538826 0.00000024937152853788 −0.0000000016603244890 1 0.0000000290865433475 −0.00000000017844290021
.ends ERs Similarly, a SPICE file of the nonlinear voltage dependent voltage source ELm is as follows.
.SubCkt ELm 1 2 3 4
ELm 1 2 POLY(1) (3, 4) 0.7232581232321 99n 0.0198970396520508n −0.011978585689462 3n 0.00247424663785978n −0.0002285839802596n 0.00000909218094302666n −0.00000011805119975311n
.ends ELm Similarly, a SPICE file of the nonlinear voltage dependent voltage source EL1 is as follows.
.SubCkt EL1 1 2 3 4
EL1 1 2 POLY(1) (3, 4) 4.53205667033262n −0.984921510706954n 0.595071352290688n −0.158605297069357n 0.0200155142021572n −0.00118945122477054n 0.00002664690751513770n
.ends EL1

Similarly, a SPICE file of the nonlinear voltage dependent voltage source ERL1 is as follows.

.SubCkt ERL1 1 2 3 4
ERL1 1 2 POLY(1) (3, 4) 2.73258278685171
0.481907262314053 −0.25898996099022 0.0
56806477468399 −0.0047010713511213
0.000147071360224516 −0.00000095306129438422
.ends ERL1

Similarly, a SPICE file of the nonlinear voltage dependent voltage source EL2 is as follows.
.SubCkt EL2 1 2 3 4
EL2 1 2 POLY(1) (3, 4) 1.54268714283216n
0.124972063913901n −0.0582841255290987n
0.00991176261868532n −0.0007648956511897746n
0.0000248792005899112n −0.000000227 27901184683n
.ends EL2

Similarly, a SPICE file of the nonlinear voltage dependent voltage source ERL2 is as follows.
.SubCkt ERL2 1 2 3 4
ERL2 1 2 POLY(1) (3, 4) 0.103716714783374
0.00682852000727507 −0.002204618337515
0.000296431374728456 −0.00000456605786247621
−0.00000105869900007827 0.0000 0004238677260918
.ends ERL2

Similarly, a SPICE file of the nonlinear voltage dependent voltage source EL3 is as follows.
.SubCkt EL3 1 2 3 4
EL3 1 2 POLY(1) (3, 4) 6.14413077435529n
52.7931735582097n −19.8567230608169n
3.41731675889605n−0.30560434616109n
0.0138135945157956n −0.000249583087915006n
.ends EL3

Similarly, a SPICE file of the nonlinear voltage dependent voltage source ERL3 is as follows.
.SubCkt ERL3 1 2 3 4
ERL3 1 2 POLY(1) (3, 4) 32.7190137783546
7.27675459184683 0.0543032142013544
−0.0536721376302012 −0.0305488886810963
0.004381140217248 −0.00014706400149489
.ends ERL3

Similarly, a SPICE file of the nonlinear voltage dependent voltage source ERp1 is as follows.
.SubCkt ERp1 1 2 3 4
ERp1 1 2 POLY(1) (3, 4) 3905.32919633761
−4104.01636464893 3781.0985469371−1020.1136858724
115.832754431758 −5.60769003961468
0.0971356035161079
.ends ERp1

Similarly, a SPICE file of the nonlinear voltage dependent voltage source ECp is as follows.
.SubCkt ECp 1 2 3 4
ECp 1 2 POLY(1) (3, 4) 284165.174548119p
189766.079986095p −89944.8571841717p 18
018.4963454604p −2077.4096391499p
129.349731182446p −3.17375199662638p
.ends ECp Similarly, a SPICE file of the nonlinear voltage dependent voltage source ERp2 is as follows.
.SubCkt ERp2 1 2 3 4
ERp2 1 2 POLY(1) (3, 4)
22502.8299812898−13660.9637147486 19324.678618595
−5004 0.10929205268 530.803759130183
−25.2464732352237 0.446178590163981
.ends ERp2

Figure 13A:
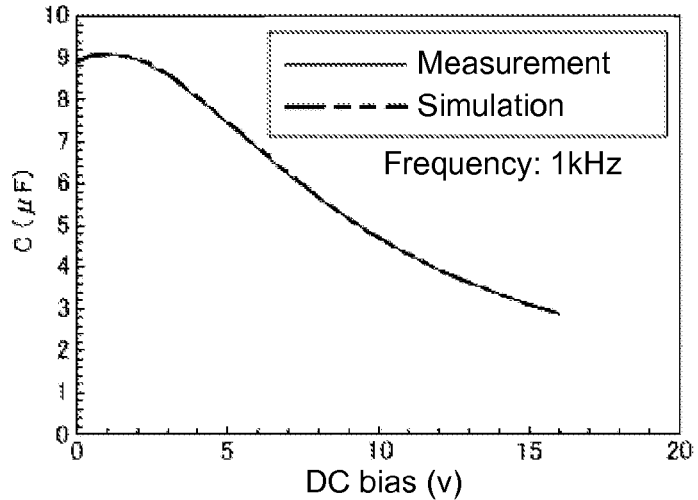
FIGS. 13A-13C show comparison graphs of actual measurements and simulations in respective models according to Embodiments 1 to 3, respectively.

FIG. 13A shows DC bias characteristics of the subject product when Model 1 is used. The graph shows capacitance at frequency of 1 kHz on the vertical axis, and DC bias voltage on the horizontal axis. As shown in this graph, the simulations of the capacitance obtained by the SPICE model completely match the measurements.

Figure 13B:
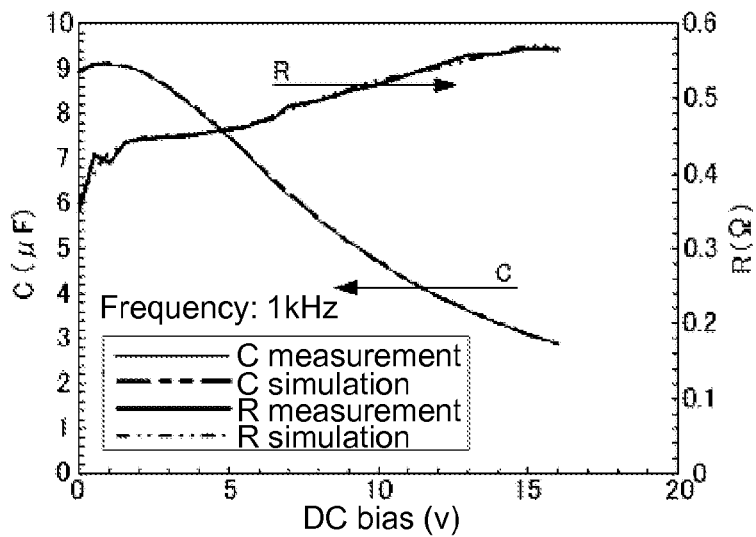

FIG. 13B shows DC bias characteristics of the subject product when Model 2 is used. The graph shows capacitance and resistance at frequency of 1 kHz on the vertical axes, and DC bias voltage on the horizontal axis. As shown in this graph, while the simulations of capacitance completely match the measurements, there exist a certain amount of errors (maximum relative error 5.6%) in the resistance at low DC bias voltages (0.5V and 1.0V). From the measurement data, it was found that large deviations occurred in the measurements at the DC bias voltage values of 0.5V and 1.0V. This is considered to be due to variations in the measurement.

Figure 13C:
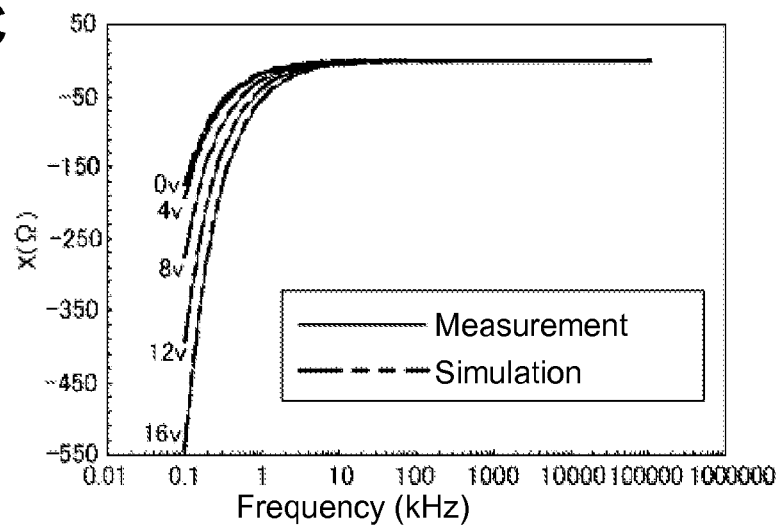

FIG. 13C shows frequency characteristics of the subject product with the DC bias applied when Model 3 is used. The graph shows reactance on the vertical axis, and frequency (on a logarithmic scale) on the horizontal axis. As shown in this graph, frequency characteristics of the reactance of the SPICE model are in good agreement with the measurements.

Figure 14A:
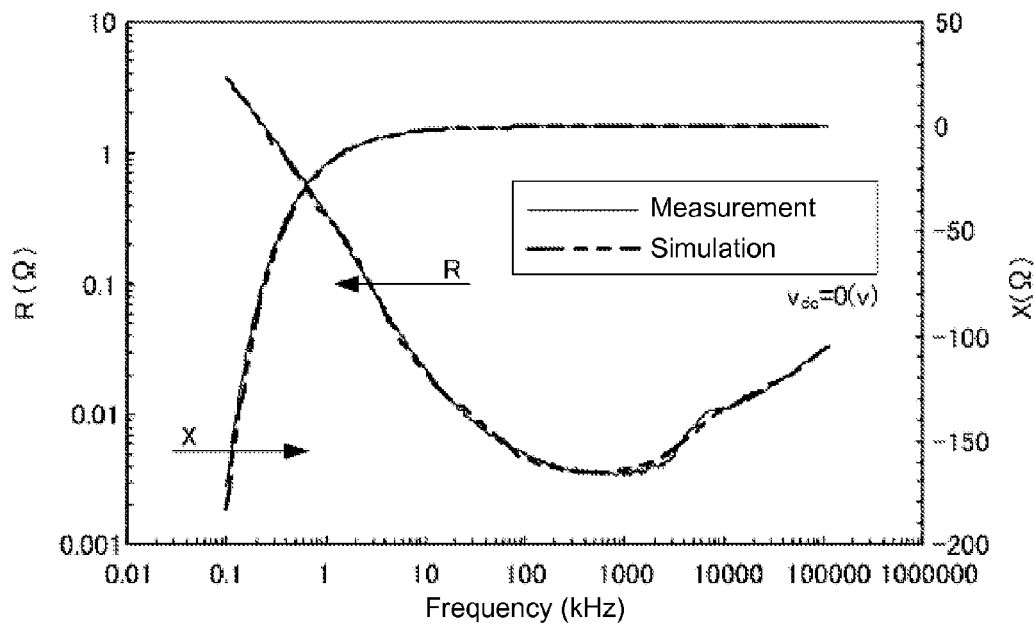
FIGS. 14A-14B show comparison graphs of actual measurements and simulations in the model according to Embodiment 4.
Figure 14B:
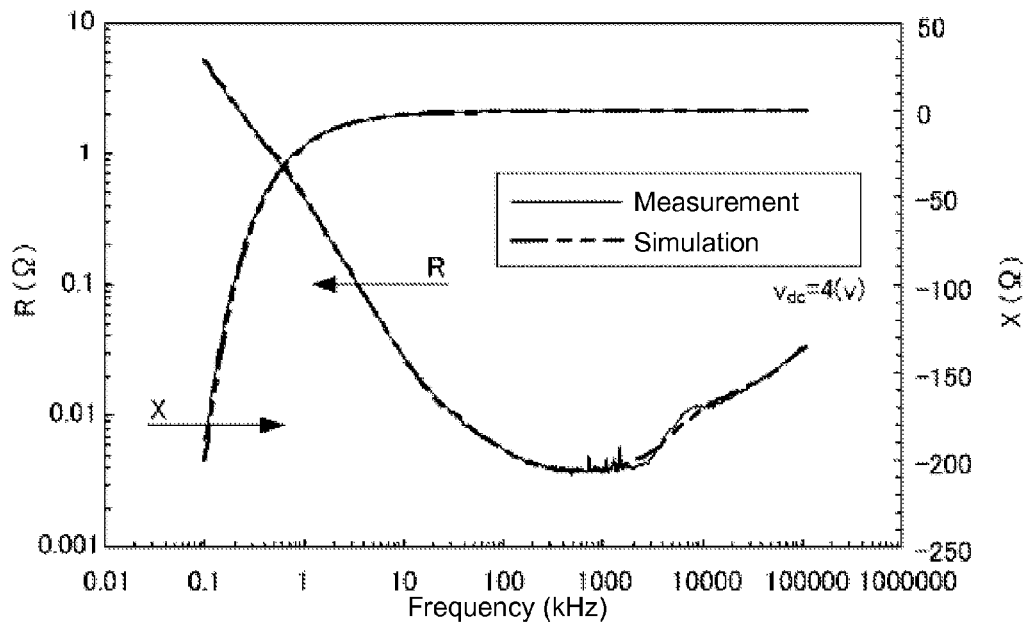
Figure 15A:
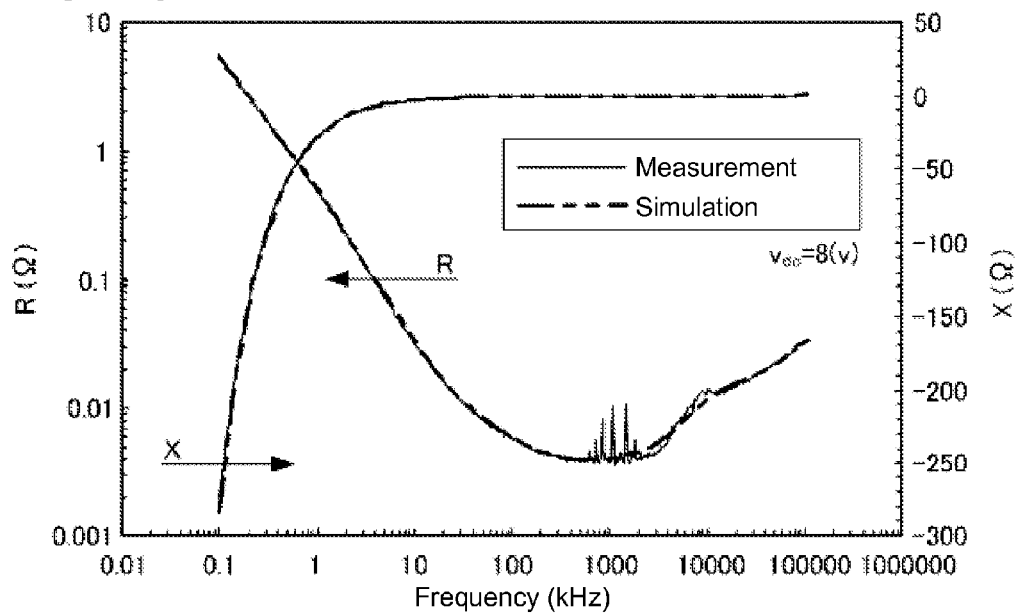
FIGS. 15A-15B show comparison graphs of actual measurements and simulations in the model according to Embodiment 4.
Figure 15B:
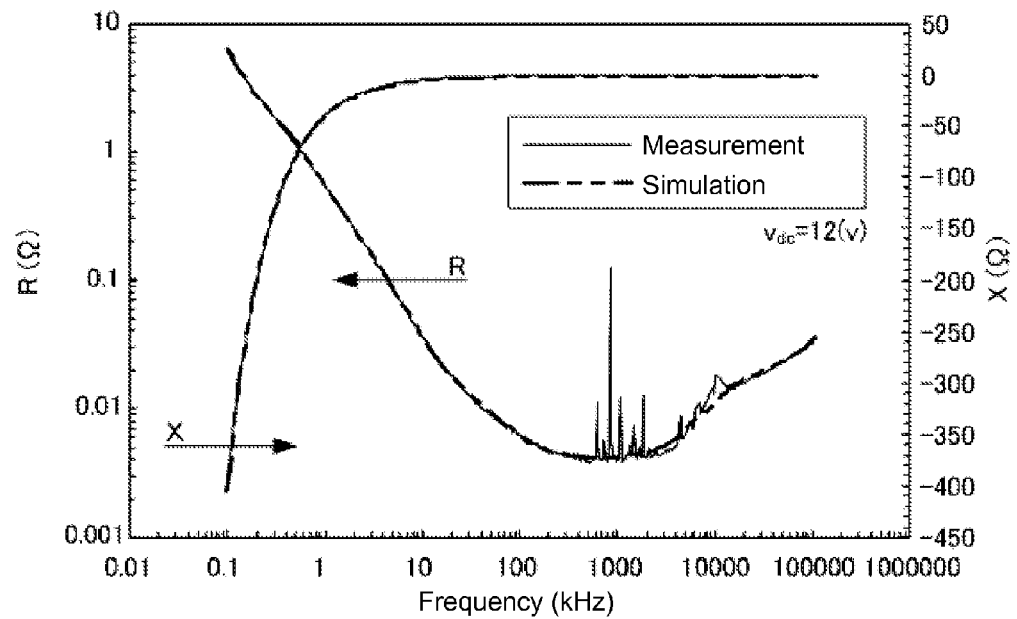
Figure 16:
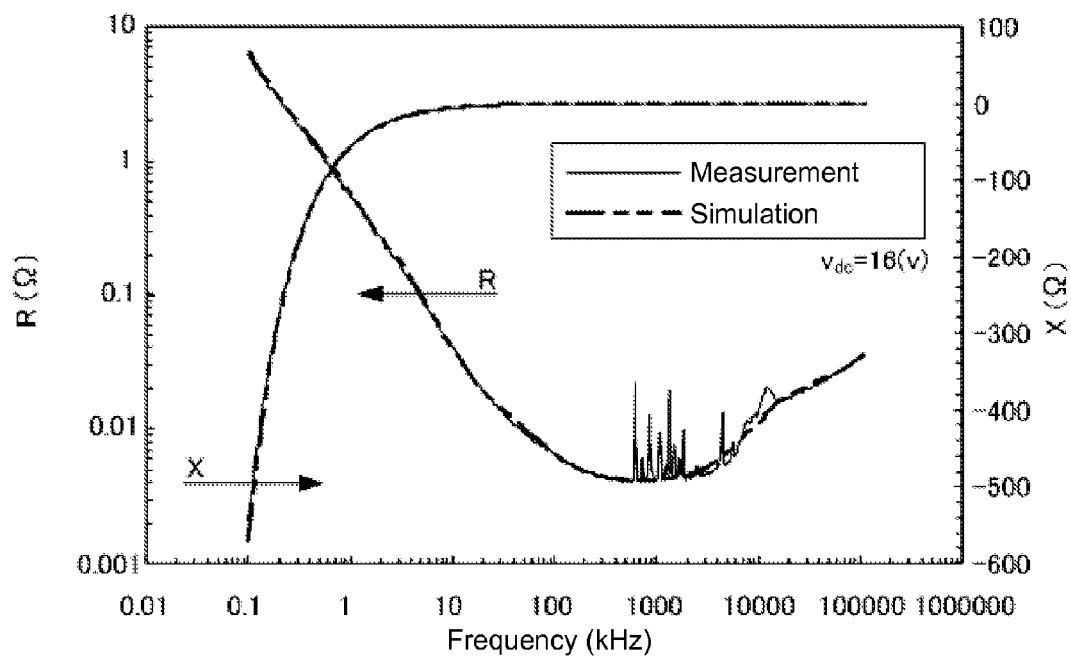
FIG. 16 shows a comparison graph of actual measurements and simulations in the model according to Embodiment 4.

FIGS. 14 to 16 show frequency characteristics of the subject product with the DC bias applied when Model 4 is used. DC bias voltages are set to 0V in FIG. 14A, 4V in FIG. 14B, 8V in FIG. 15A, 12V in FIG. 15B, and 16V in FIG. 16. FIGS. 14 to 16 show resistance and reactance on the vertical axes, and frequency (on a logarithmic scale) on the horizontal axis. These graphs show that the simulations of the circuit impedance, not only the reactance, but also the resistance, are in good agreement with the measurements.

However, in the measured resistance value, large measurement noise was generated in a range between 600 kHz and 1100 kHz as the DC bias voltage is applied. The magnitude of this noise becomes larger with increase in the DC bias voltage. This is considered to be due to the presence of the piezoelectric effect in the MLCC, which is the subject product. When the DC bias voltage was applied across the MLCC, the piezoelectric effect presumably caused minute vibrations to occur in the subject product, which became noise and affected the measurement. It appears that the frequency at which the noise occurs is linked to the dielectric material and the length of the subject product.

As described above, although there exist the effects of noise and the like, overall, the measurements and the simulations are in good agreement with each other. This means that the SPICE model of the present invention represents characteristics of the capacitor accurately. As a result, the following effects are provided.

(1) An electronic component manufacturer or its representative trading company can provide a customer with the SPICE model for a capacitor product (MLCC, in particular) according to the present invention in certain manners such as publishing the SPICE model on the company website and creating a SPICE file for or programming the SPICE model into commercially available SPICE simulators. By using the SPICE model, a customer can design a circuit of an electronic device that uses the capacitor product with high accuracy. Because the highly-accurate circuit can be designed, the customer purchases the capacitor product from the electronic component manufacturer or its representative trading company. In this way, the electronic component manufacturer or its representative trading company can increase sales of the capacitor product.

(2) By using the SPICE model of the present invention, the customer, which is an electronic device manufacturer or an electric circuit design company, can design an electronic device with high accuracy and can therefore greatly reduce the design time. Also, the SPICE model of the present invention can be utilized for verification and device failure analysis of the capacitor product.

Embodiment 5

Figure 17:
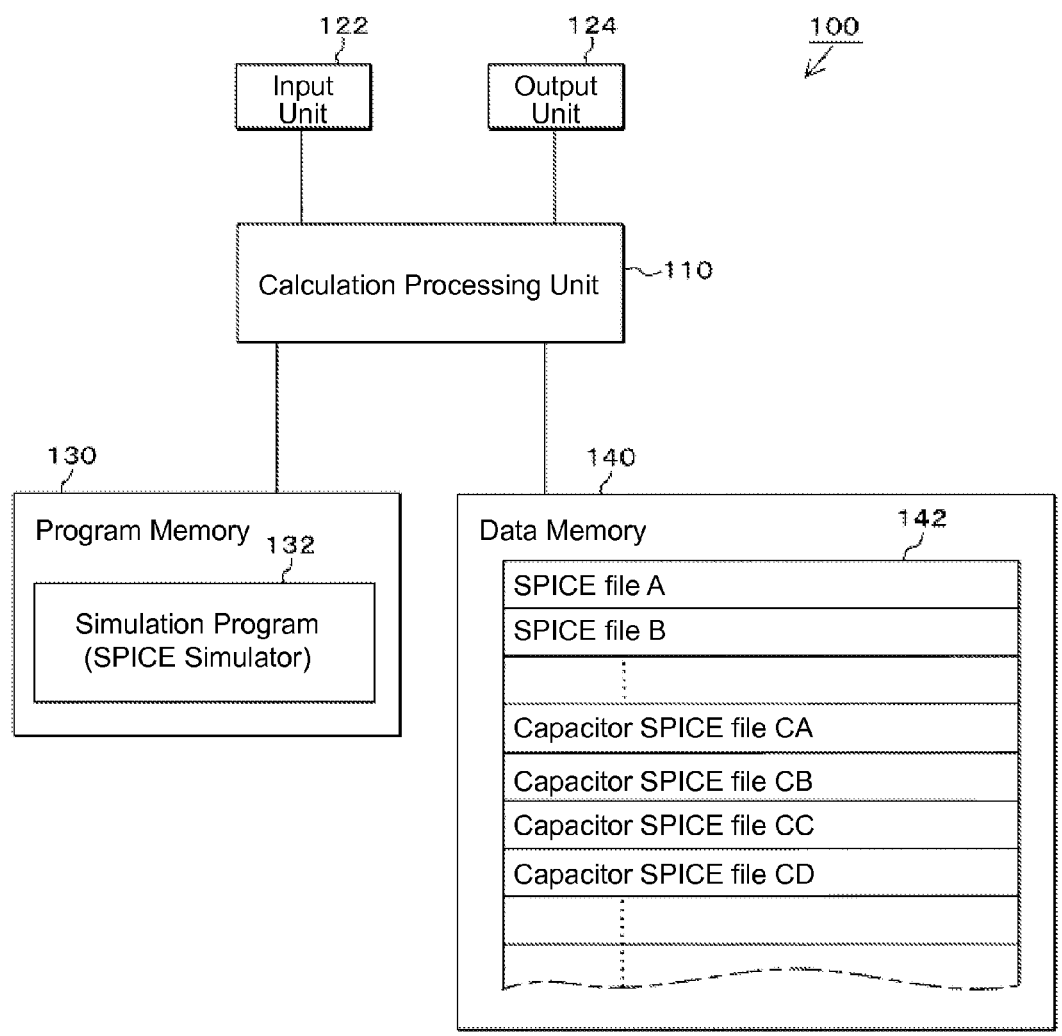
FIG. 17 shows a configuration of a simulation device according to Embodiment 5 of the present invention.
Figure 18A:
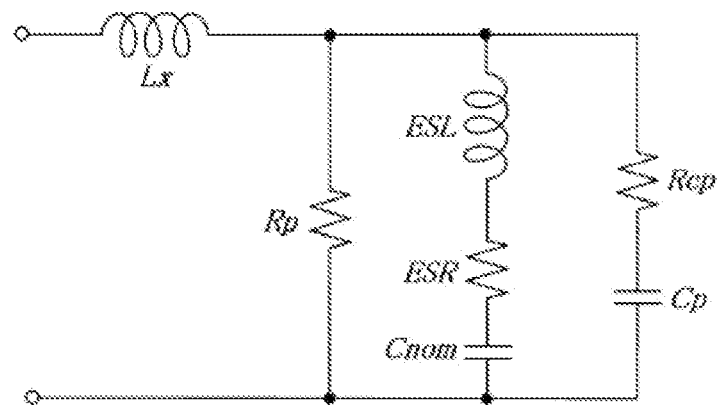
FIGS. 18A-18B show circuit diagrams illustrating equivalent circuits for a capacitor in the background art.
Figure 18B:
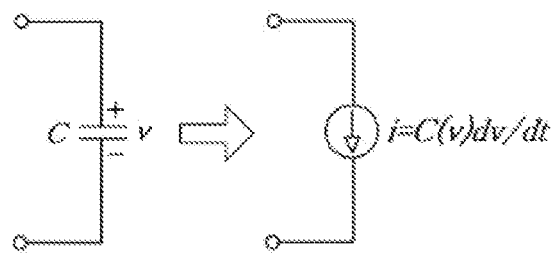

Next, an embodiment of a simulation apparatus will be explained with reference to FIG. 17. A simulation apparatus 100 of the present embodiment is constituted of a general computer system, and is configured in such a way that an input unit 122 such as a keyboard or the like, an output unit 124 such as a liquid crystal display or the like, a program memory 130, and a data memory 140 are connected to a calculation processing unit 110, which is constructed by a CPU as the main component. A simulation program, a SPICE simulator 132, for example, is contained in the program memory 130. In the data memory 140, SPICE files 142 of various types described earlier are stored. In the figure, a capacitor SPICE file CA, a capacitor SPICE file CB, a capacitor SPICE file CC, and a capacitor SPICE file CD are SPICE files for the SPICE model shown in FIG. 1B, the SPICE model shown in FIG. 3B, the SPICE model shown in FIG. 4B, and the SPICE model shown in FIG. 12, respectively. These capacitor SPICE files CA to CD are prepared for each of the capacitors, and more specifically, for each of capacitor model numbers of respective manufacturers.

Based on input instructions from the input unit 122, the calculation processing unit 110 reads the SPICE files of the electronic components in a circuit subject to simulation from the data memory 140, incorporates these files into the SPICE simulator 132, and performs calculation processing such as simulation of circuit characteristics and the like. By using the above-mentioned SPICE files CA to CD of the SPICE models of Embodiments 1 to 4 for a capacitor, very accurate simulation results can be obtained.

Effects such as the following can be obtained according to the embodiments of the present invention described above.

(1) An electronic component manufacturer or a representative trading company thereof can provide a SPICE file for its capacitors to a customer, or publish it on the company website so that customers who use the company's product can use the SPICE file in designing a circuit.

(2) An electronic component manufacturer or its representative trading company can attempt to increase the sales channels for the products of the company by making a SPICE file for the SPICE model of their capacitor or by programming the SPICE model so that they can be incorporated into a commercially available SPICE simulator, or alternatively, can be published on the company website for customers to download.

(3) By using the above-mentioned published SPICE models or SPICE files, an electronic device manufacturer or an electronic circuit design company can design an electronic product with high accuracy and can greatly reduce the design time. They can also perform acceptance verification of the capacitor, device failure analysis, and the like.

It should be noted that the present invention is not limited to the above-mentioned embodiments, and various modifications can be made without departing from the spirit of the present invention. The following modifications can be made, for example.

(1) The equivalent circuits such as the idealized C circuit model or the RC circuit model, filter circuits, and the like in the embodiments above are examples. Various other circuit configurations that have the same effects can be used.

(2) The circuit equations and the sets of equations provided for the basic equivalent circuits in the embodiments above are examples. The circuit equations and the simultaneous equations can be modified.

(3) The methods of defining the operation devices constituting the calculation circuits shown in the embodiments above are examples. Other methods can also be used.

(4) The embodiments above have described the case in which the present invention was used for a SPICE simulator, but that does not hinder the applications of the present invention to other various circuit simulators. The present invention can be programmed in different computer programming languages such as FORTRAN, C, and the like, and incorporated into various circuit simulators.

(5) The embodiments above have described the construction of the SPICE model for the capacitor with the DC bias applied thereto, but this method can also be used for construction of a SPICE model in which the capacitance and the impedance characteristics are changed by temperature. In this case, the low-pass filter unit for extracting a DC bias voltage in the SPICE model of the above-mentioned embodiments is replaced with a voltage source that represents a temperature, and all temperature-dependent circuit elements in a basic equivalent circuit are replaced with nonlinear voltage dependent voltage sources that are controlled by the voltage source that represents the temperature. The nonlinear voltage dependent voltage sources are defined by polynomials that express the measurements of the characteristics change in the circuit elements caused by the temperature.

(6) A temperature condition may be added to the above-mentioned embodiments. In this case, a voltage source that represents a temperature is added to the SPICE model of the above-mentioned embodiments. The nonlinear voltage dependent voltage sources that replace all of the circuit elements in the basic equivalent circuit are controlled by two voltages, which are a DC bias voltage and a voltage that represents a temperature.

According to the present invention, characteristics of a capacitor can be represented suitably for purposes, and therefore, the present invention can be suitably used for precise circuit design and circuit analysis performed by a simulation.

It will be apparent to those skilled in the art that various modification and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

The invention claimed is:

1. A method of constructing a circuit simulation model for a capacitor having a DC bias applied thereto, comprising steps of:
configuring, in a computer, a basic equivalent circuit for a capacitor;
deriving a circuit equation for a voltage and a current based on the configured basic equivalent circuit;
obtaining a characteristics change in a circuit element included in the basic equivalent circuit caused by the DC bias by actual measurement;
expressing the obtained characteristics change in the circuit element by a polynomial, and replacing the circuit element with a nonlinear voltage dependent voltage source defined by the polynomial;

constructing a calculation circuit that supplies a component of the DC bias extracted from a voltage applied across the capacitor to the nonlinear voltage dependent voltage source and that performs calculation of the circuit equation by utilizing an output voltage of the nonlinear voltage dependent voltage source; and applying the voltage applied across the capacitor to the calculation circuit through a linear voltage dependent voltage source.

2. A circuit simulation method, wherein a simulation of a circuit that includes a capacitor is performed by using the circuit simulation model constructed by the method of constructing a circuit simulation model for a capacitor according to claim 1.

3. A circuit simulator, comprising a processor that executes a simulation program that performs a simulation of a circuit that includes a capacitor by using the circuit simulation model constructed by the method of constructing a circuit simulation model for a capacitor according to claim 1.

4. A circuit simulation model for a capacitor having a DC bias applied thereto, comprising:
　　a computer configured to emulate:
　　a nonlinear voltage dependent voltage source that replaces a circuit element included in a prescribed basic equivalent circuit of the capacitor, the non-linear voltage dependent voltage source being defined by a polynomial that represents characteristics change caused by a DC bias in the circuit element measured by actual measurement;
　　a filter that extracts a DC bias component from a voltage applied to the capacitor and that supplies the DC bias component to the nonlinear voltage dependent voltage source;
　　a calculation circuit that performs calculation of a circuit equation for a voltage and a current that is derived based on the basic equivalent circuit, by utilizing a respective output voltage of the nonlinear voltage dependent voltage source; and
　　a linear voltage dependent voltage source that couples the voltage applied across the capacitor to the calculation circuit.

5. A method of constructing a circuit simulation model for a capacitor having a capacitance that depends on an amount of a DC component of a voltage applied across the capacitor, the method comprising steps of:
　　configuring, in a computer, an equivalent circuit for the capacitor, the equivalent circuit containing at least one element characteristics of which depend on the DC component of the voltage applied across the capacitor;
　　deriving a set of circuit equations governing the configured equivalent circuit;
　　determining a characteristics change due to the DC component in the at least one element;
　　approximating the determined characteristics change due to the DC component by a truncated polynomial for each of the at least one circuit elements;
　　representing each of the at least one circuit element by a nonlinear voltage dependent voltage source defined by the truncated polynomial; and
　　constructing a calculation circuit that extracts the DC component from the voltage applied across the capacitor, that supplies the extracted DC to the nonlinear voltage dependent voltage source, and that solves the set of circuit equations by utilizing an output voltage from the nonlinear voltage dependent voltage source.

6. The method according to claim 5, wherein the at least one element in the equivalent circuit includes at least one capacitor having a capacitance that depends on the DC component non-linearly, at least one inductor having an inductance that depends on the DC component non-linearly, and at least one resistor having a resistance that depends on the DC component non-linearly; and the DC component dependencies of the capacitance, the inductance, and the resistance are approximated by polynomials, respectively, in the step of approximating.

* * * * *